(12) United States Patent
Sakakibara et al.

(10) Patent No.: US 9,356,043 B1
(45) Date of Patent: May 31, 2016

(54) THREE-DIMENSIONAL MEMORY DEVICES CONTAINING MEMORY STACK STRUCTURES WITH POSITION-INDEPENDENT THRESHOLD VOLTAGE

(71) Applicant: SANDISK TECHNOLOGIES INC., Plano, TX (US)

(72) Inventors: Kiyohiko Sakakibara, Yokkaichi (JP); Shinsuke Yada, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/746,042

(22) Filed: Jun. 22, 2015

(51) Int. Cl.
*H01L 29/792* (2006.01)
*H01L 27/115* (2006.01)

(52) U.S. Cl.
CPC ...... *H01L 27/11582* (2013.01); *H01L 27/1157* (2013.01); *H01L 27/11565* (2013.01)

(58) Field of Classification Search
CPC .............. H01L 27/11582; H01L 27/1157; H01L 27/11565
USPC ........................................................ 257/324
See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| 7,129,538 B2 | 10/2006 | Lee et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |

(Continued)

FOREIGN PATENT DOCUMENTS

| | | |
|---|---|---|
| KR | 20100109745 A | 10/2010 |
| KR | 20110021444 A | 3/2011 |
| WO | WO02/15277 A2 | 2/2002 |

OTHER PUBLICATIONS

Endoh, T. et al., titled "Novel Ultra High Density Memory With a Stacked-Surrounding Gate Transistor (S-SGT) Structured Cell", IEDM Proc., pp. 33-36, (2001).

(Continued)

*Primary Examiner* — Luan C Thai
(74) *Attorney, Agent, or Firm* — The Marbury Law Group PLLC

(57) ABSTRACT

The threshold voltage for vertical transistors in three-dimensional memory stack structures can be made independent of a lateral distance from a source region by forming a doped pocket region. The doped pocket region has the same conductivity type as a doped well that constitutes horizontal portions of the semiconductor channels that extend into the memory stack structures, and has a higher dopant concentration level than the doped well. The doped pocket region and a source region can be simultaneously formed by implanting p-type dopants and n-type dopants into a surface portion of the substrate underlying a backside contact trench. By selecting dopant species having different diffusion rates, the doped pocket region can surround the source region. The process parameters of the anneal process can be selected such that the interface between the dopant pocket region and the doped well underlies outermost memory stack structures.

21 Claims, 21 Drawing Sheets

(56) References Cited

U.S. PATENT DOCUMENTS

| | | | |
|---|---|---|---|
| 7,764,534 B2 | 7/2010 | Thorp et al. | |
| 7,808,038 B2 | 10/2010 | Mokhlesi et al. | |
| 7,825,455 B2 | 11/2010 | Lee et al. | |
| 7,846,782 B2 | 12/2010 | Maxwell et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,932 B2 | 5/2012 | Nguyen et al. | |
| 8,394,716 B2 | 3/2013 | Hwang et al. | |
| 8,520,425 B2 | 8/2013 | Xiao et al. | |
| 8,877,624 B2 * | 11/2014 | Hull | H01L 29/401 438/591 |
| 8,878,278 B2 * | 11/2014 | Alsmeier | G11C 16/04 257/314 |
| 8,987,089 B1 * | 3/2015 | Pachamuthu | H01L 27/11551 438/268 |
| 2003/0062574 A1 | 4/2003 | Hsieh | |
| 2007/0210338 A1 | 9/2007 | Orlowski | |
| 2007/0252201 A1 | 11/2007 | Kito et al. | |
| 2009/0003082 A1 | 1/2009 | Meeks et al. | |
| 2009/0230449 A1 | 9/2009 | Sakaguchi et al. | |
| 2010/0013049 A1 | 1/2010 | Tanaka et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0254191 A1 | 10/2010 | Son et al. | |
| 2010/0320528 A1 | 12/2010 | Jeong et al. | |
| 2011/0031546 A1 | 2/2011 | Uenaka et al. | |
| 2011/0076819 A1 | 3/2011 | Kim et al. | |
| 2011/0133606 A1 | 6/2011 | Yoshida et al. | |
| 2011/0169071 A1 | 7/2011 | Uenaka | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0147648 A1 | 6/2012 | Scheuerlein | |
| 2013/0264631 A1 | 10/2013 | Alsmeier et al. | |
| 2013/0313627 A1 | 11/2013 | Lee | |
| 2015/0179659 A1 | 6/2015 | Takaki | |
| 2015/0179660 A1 * | 6/2015 | Yada | H01L 21/02164 257/321 |

OTHER PUBLICATIONS

Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Lue, H.T. et al., A Novel Dual-Channel 3D NAND Flash Featuring both N-Channel and P-Channel NAND Characteristics for Bit-alterable Flash Memory and A New Opportunity in Sensing the Stored Charge in the WL Space, IEEE, IEDMI 13-82, pp. 3.7.1-3.7.4, (2013).
U.S. Appl. No. 14/133,979, filed Dec. 19, 2013, Yada et al.
U.S. Appl. No. 14/150,162, filed Jan. 8, 2014, Takaki et al.
U.S. Appl. No. 14/206,196, filed Mar. 12, 2014, Takaki.
U.S. Appl. No. 14/224,290, filed Mar. 25, 2014, Takaki.
U.S. Appl. No. 14/514,925, filed Oct. 15, 2014, Pang et al.
U.S. Appl. No. 14/595,572, filed Jan. 13, 2015, Shoji et al.
U.S. Appl. No. 14/707,459, filed May 8, 2015, Sakakibara et al.

* cited by examiner

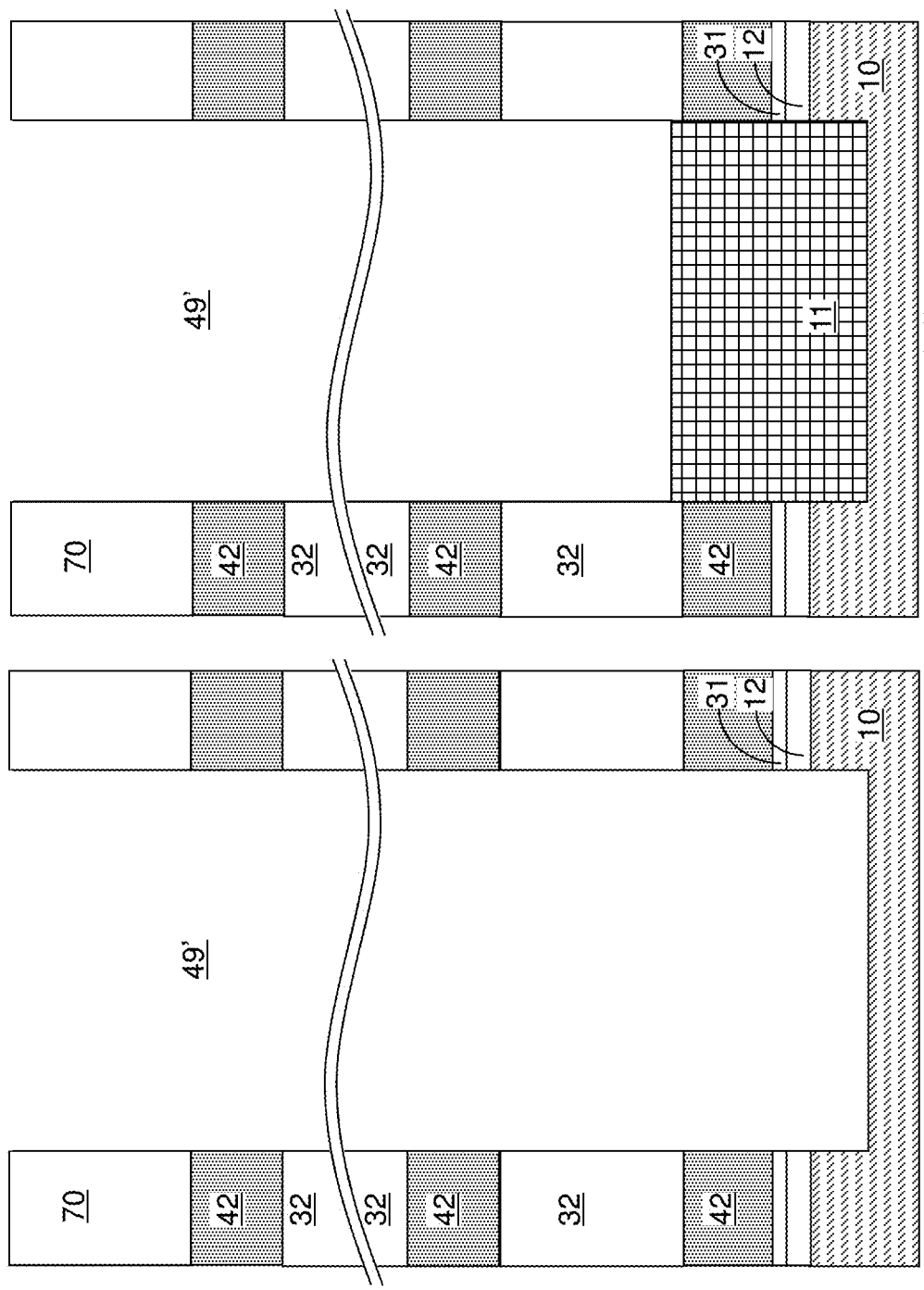

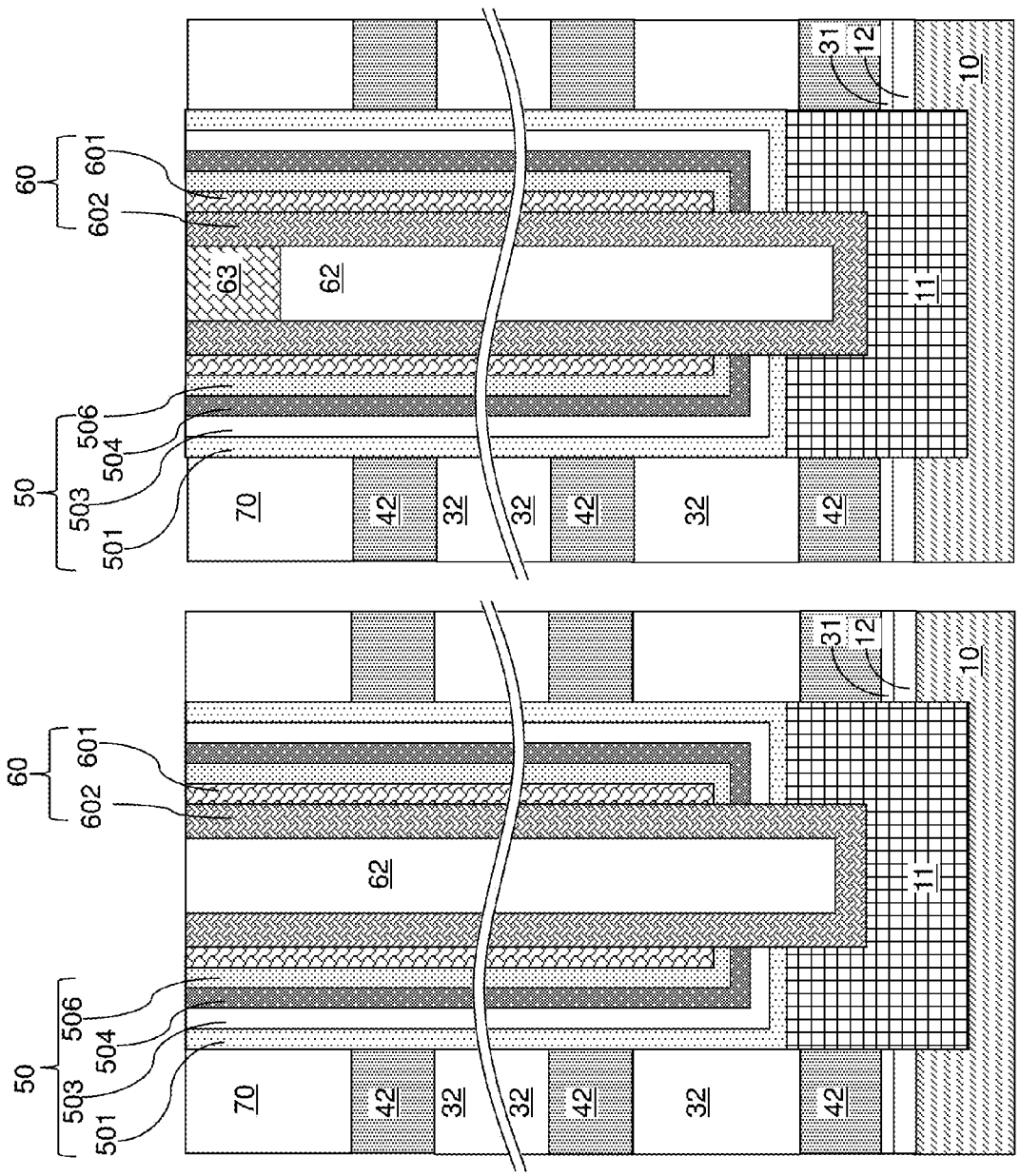

THREE-DIMENSIONAL MEMORY DEVICES CONTAINING MEMORY STACK STRUCTURES WITH POSITION-INDEPENDENT THRESHOLD VOLTAGE

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device comprises a stack of alternating layers comprising insulating layers and electrically conductive layers and located over a semiconductor region having a doping of a first conductivity type at a first dopant concentration level, a plurality of memory stack structures extending through the stack, a first backside contact via structure extending through the stack and laterally spaced from the plurality of memory stack structures, a source region underlying the first backside contact via structure and having a doping of a second conductivity that is the opposite of the first conductivity type, and a doped pocket region laterally surrounding the source region, having a doping of the first conductivity type at a second dopant concentration level that is higher than the first dopant concentration level. An interface between the doped pocket region and the semiconductor region underlies at least one first memory stack structure among the plurality of memory stack structures.

According to another aspect of the present disclosure, a method of manufacturing a memory device is provided. A stack of alternating layers comprising insulating layers and spacer material layers is formed over a substrate. A plurality of memory stack structures is formed through the stack. A backside contact trench extending through the stack and to the substrate is formed. An implanted region is formed in a portion of the substrate underlying the backside contact trench by implanting first and second conductivity type through the backside contact trench. The first and second conductivity type dopants are simultaneously outdiffused employing an anneal process performed at an elevated temperature.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

DETAILED DESCRIPTION

Figure 1:
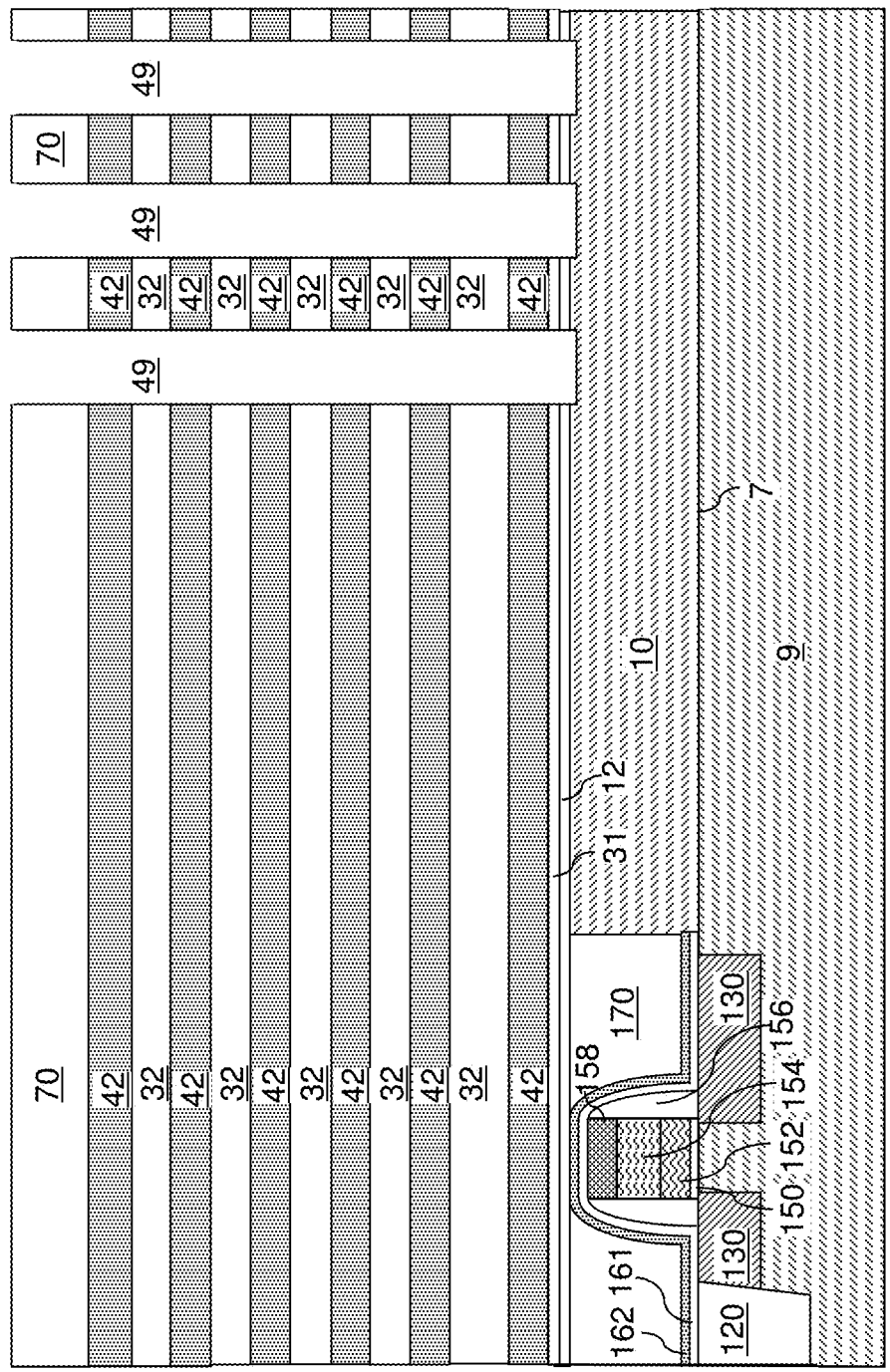
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

At least a portion of the semiconductor material layer 10 located in the device region 100 is a doped well. As used herein, a "doped well" refers to a portion of a semiconductor material having a doping of a same conductivity type (which can be p-type or n-type) and a substantially same level of dopant concentration throughout. The doped well can be the same as the semiconductor material layer 10 or can be a portion of the semiconductor material layer 10, or, in case the semiconductor material layer 10 is omitted, can be a portion of the substrate semiconductor layer 9. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of gate electrodes to be subsequently formed (at the level of the bottommost spacer layer 42). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes.

A stack of an alternating plurality of first material layers (which can be insulating layers 32) and second material layers (which are referred to spacer material layers) is formed over the top surface of the substrate, which can be, for example, on the top surface of the dielectric cap layer 31. As used herein, a "material layer" refers to a layer including a material throughout the entirety thereof. As used herein, a "spacer material layer" refers to a material layer that is located between two other material layers, i.e., between an overlying material layer and an underlying material layer. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality. The spacer material layers can be formed as electrically conductive layers, or can be replaced with electrically conductive layers in a subsequent processing step.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Figure 2C:
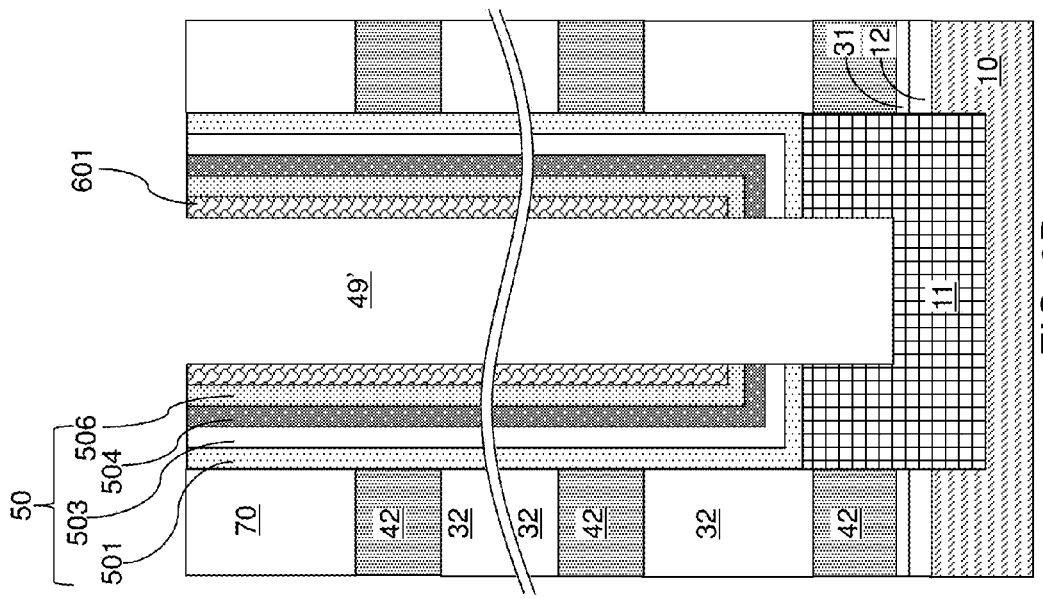

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide (e.g., $SiO_2$), a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506*l*, 601L).

Figure 2D:
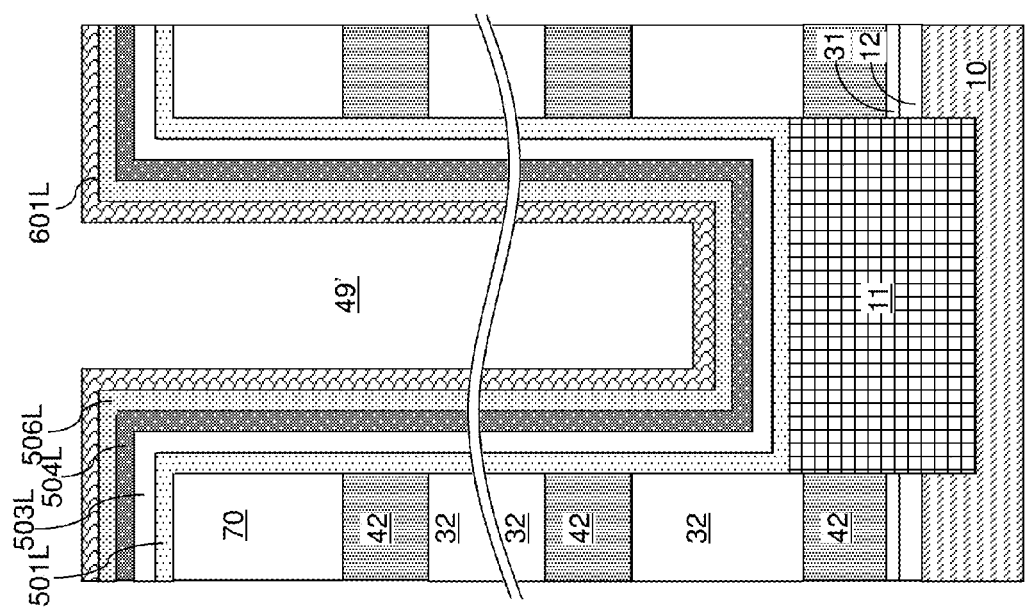

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). If the epitaxial channel portion 11 is not present, a top surface of the semiconductor material layer 10 can be physically exposed underneath the memory cavity 49'. Optionally, the physically exposed portion of the epitaxial channel portion 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2E:
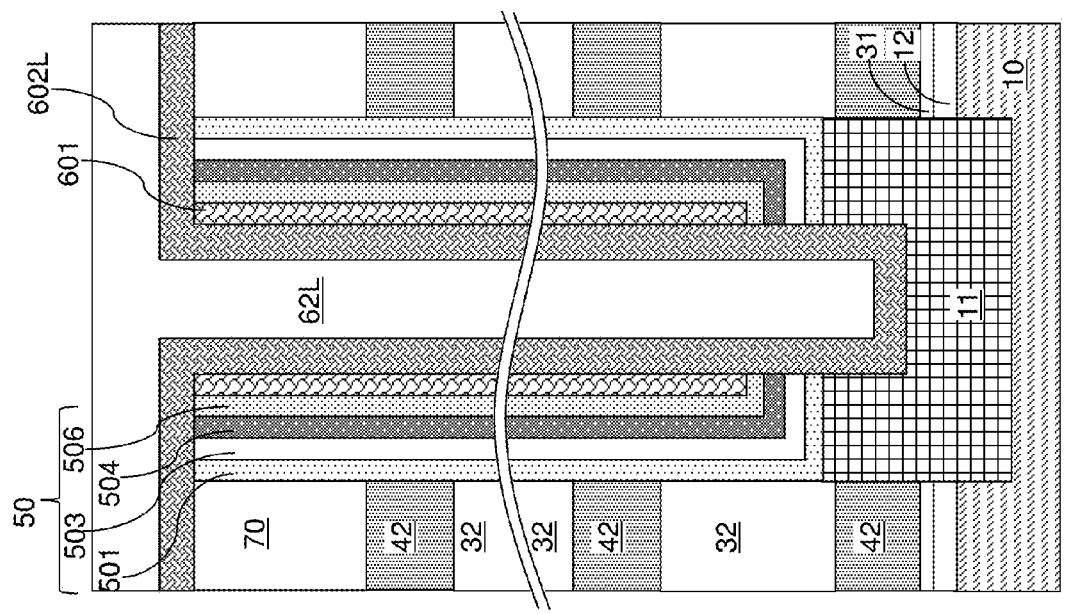

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2F:
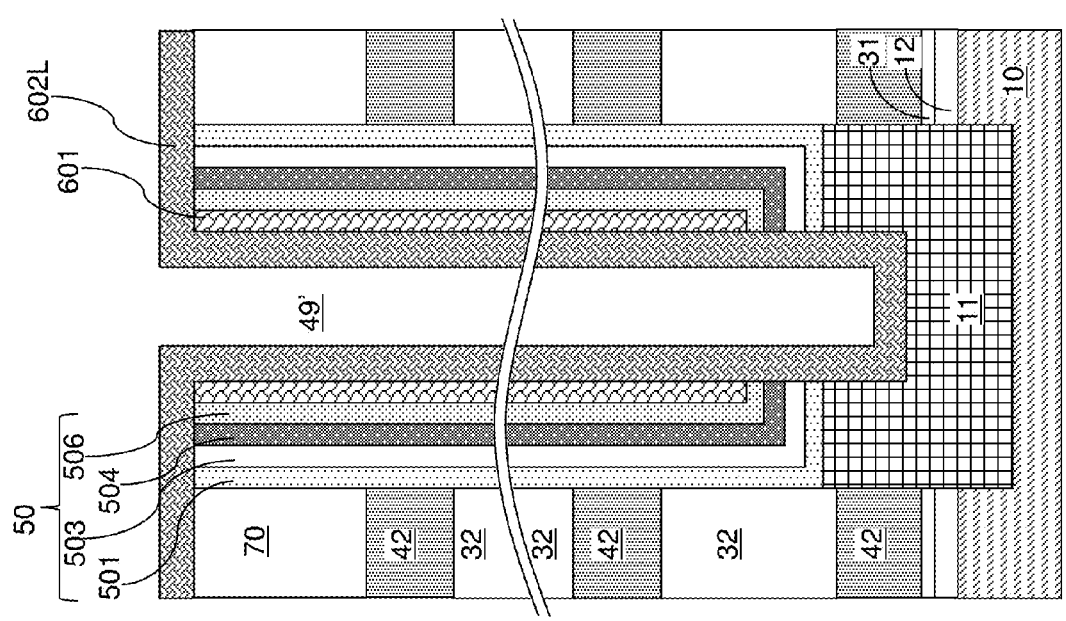

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
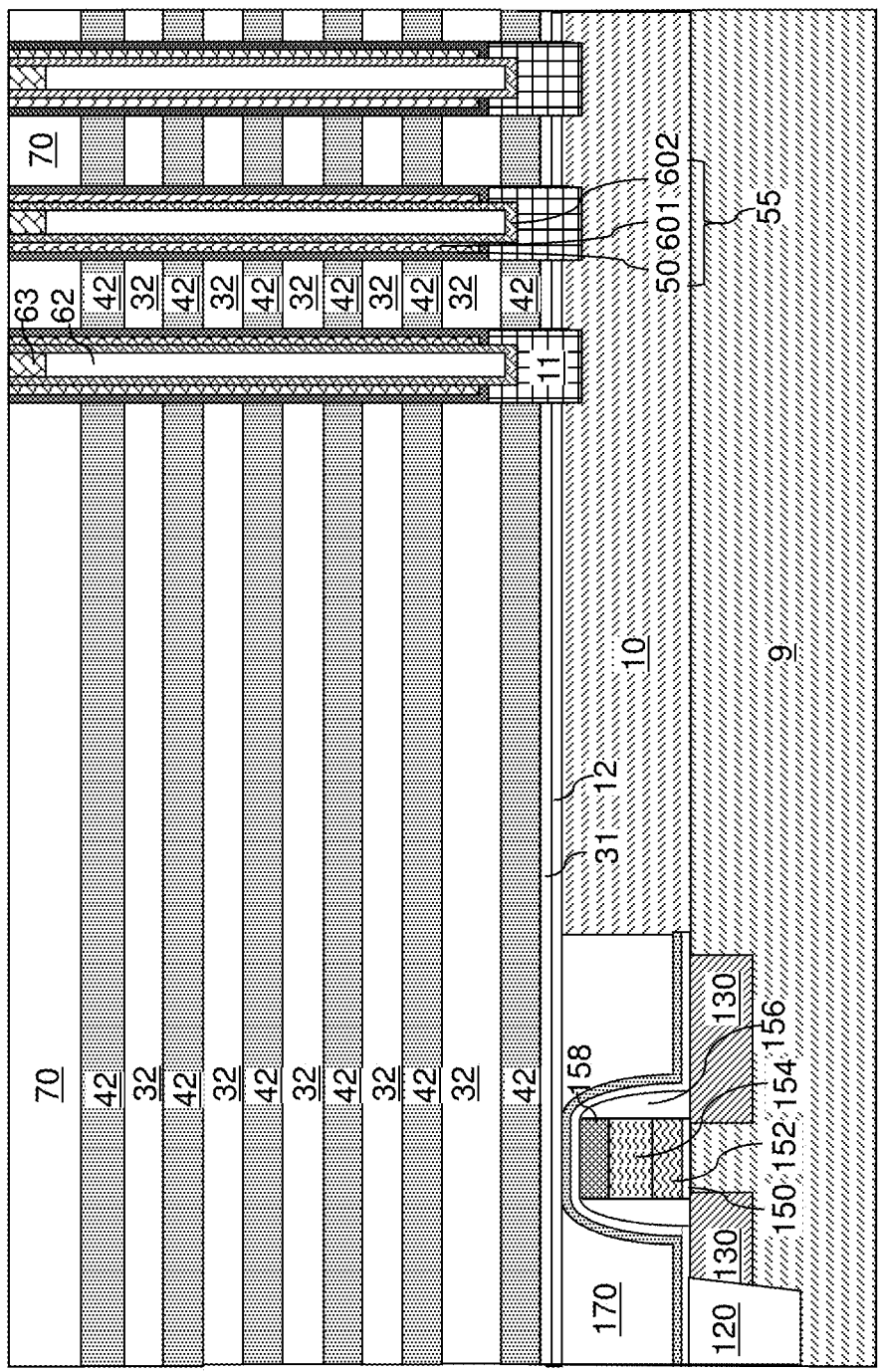
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2H. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
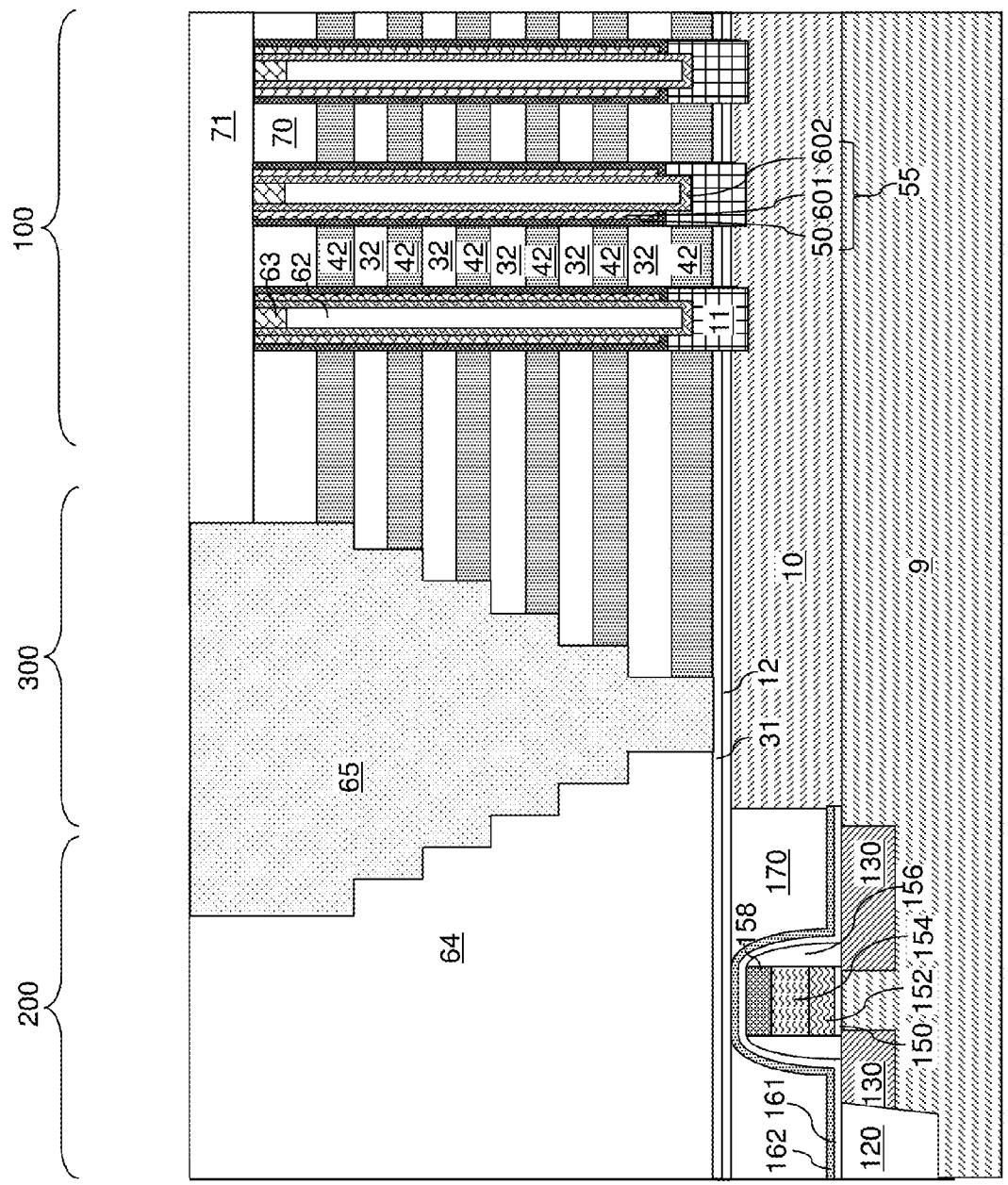
FIG. 4 is a vertical cross-sectional view of the exemplary structure after formation of a stepped terrace and a retro-stepped dielectric material portion according to an embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
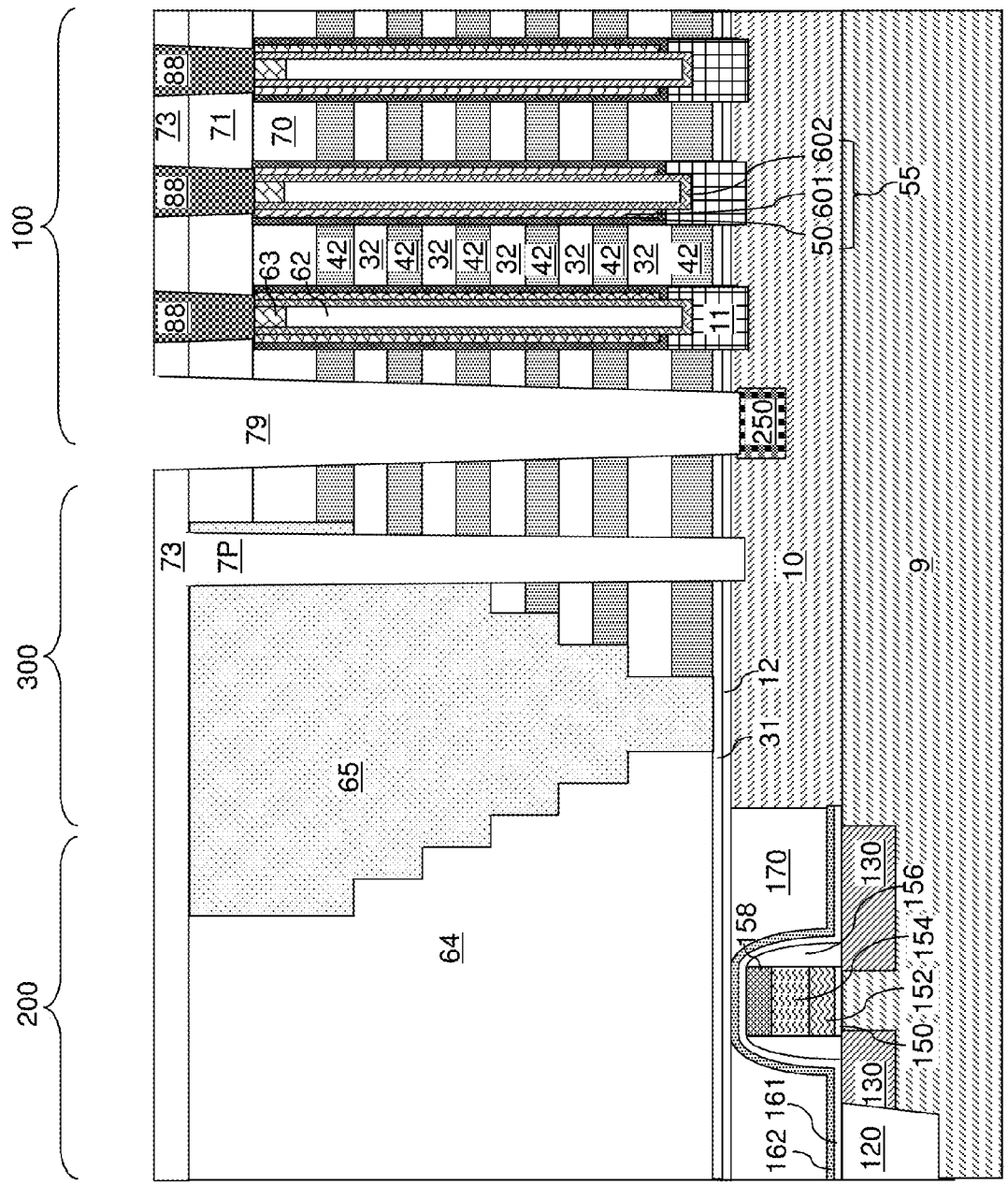
FIG. 5A is a vertical cross-sectional view of the exemplary structure after formation of a backside contact trench and an implanted region according to an embodiment of the present disclosure.
Figure 5B:
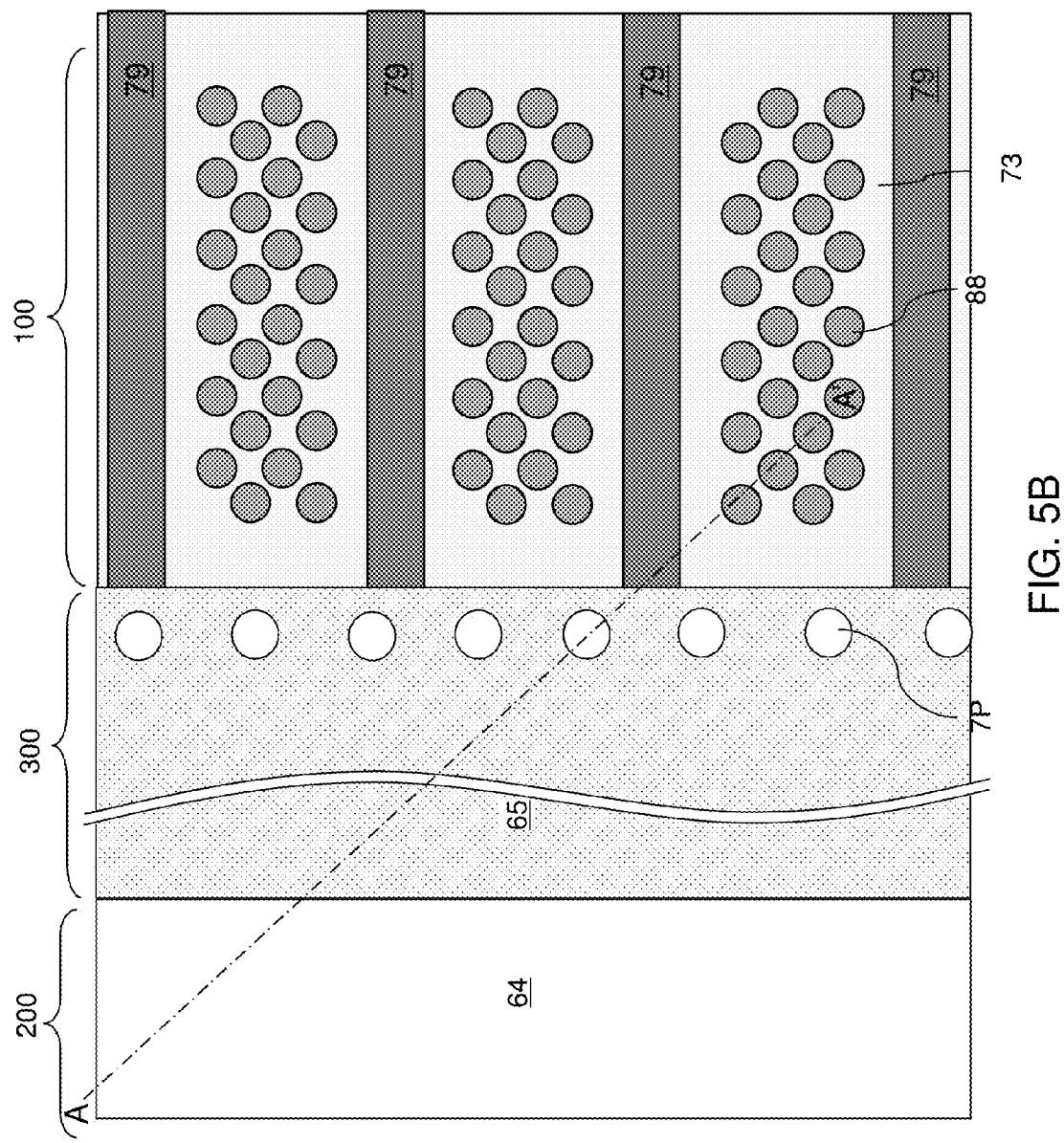
FIG. 5B is a partial see-through top-down view of the exemplary structure of FIG. 5A. The vertical plane A-A' is the plane of the vertical cross-sectional view of FIG. 5A.
Figure 6A:
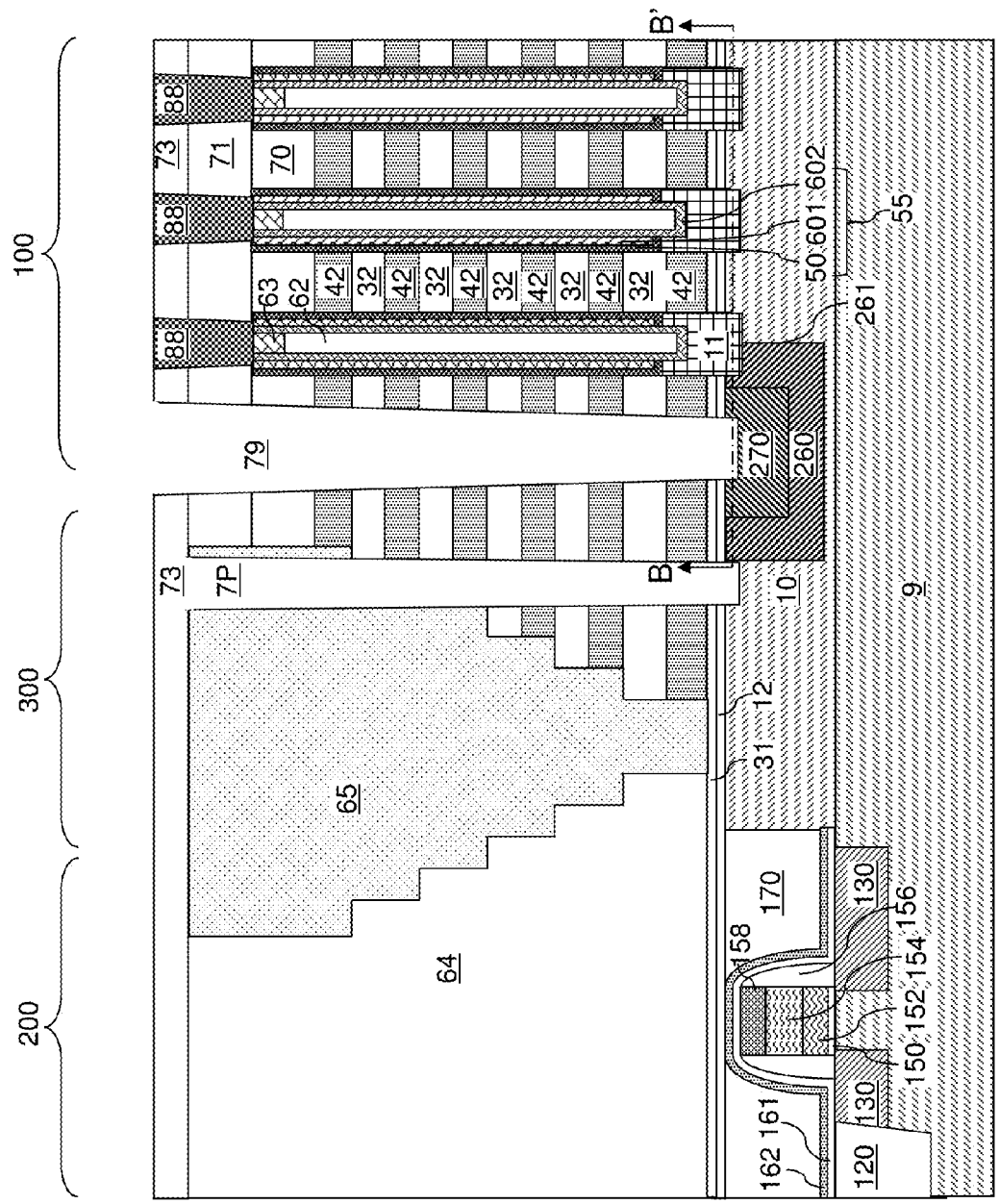
FIG. 6A is a vertical cross-sectional view of the exemplary structure after formation of a source region and a doped pocket region according to an embodiment of the present disclosure.
Figure 6B:
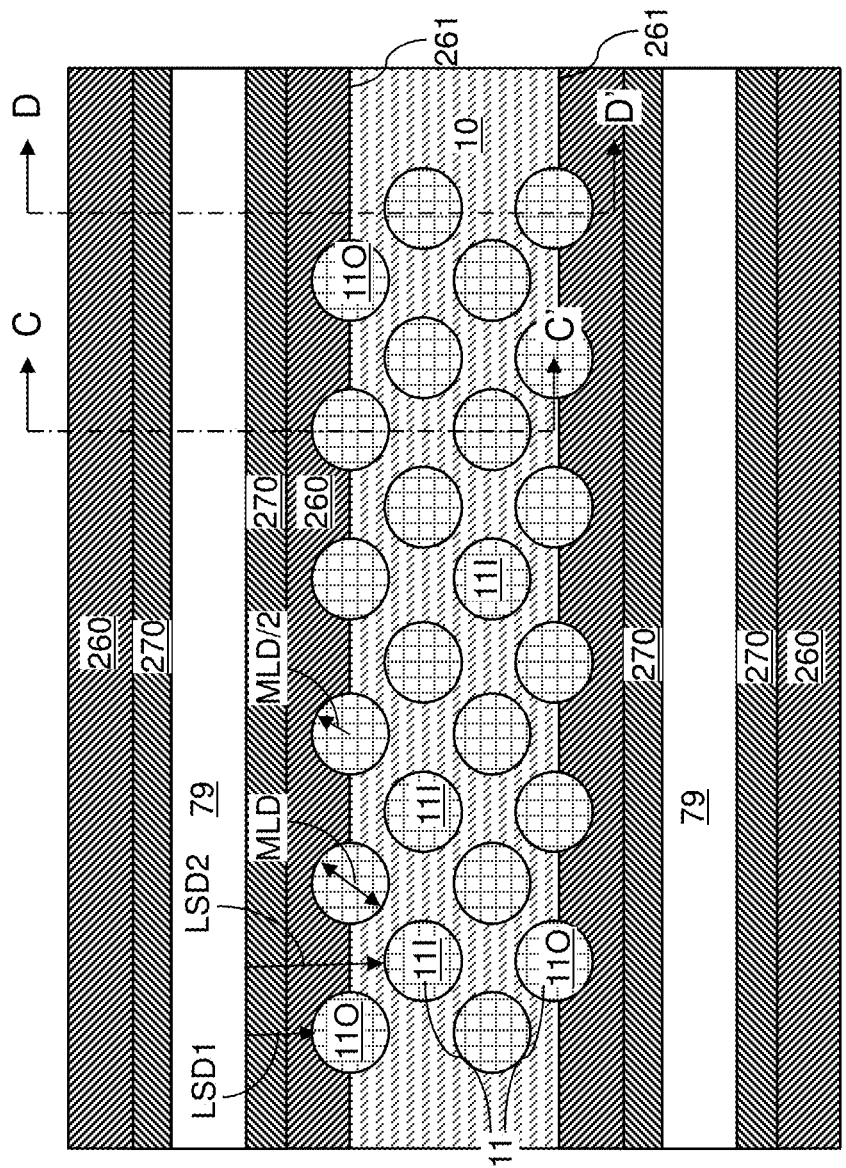
FIG. 6B is a horizontal cross-sectional view of exemplary structure of FIG. 6A along the horizontal plane B-B' of FIG. 6A.
Figure 6C:
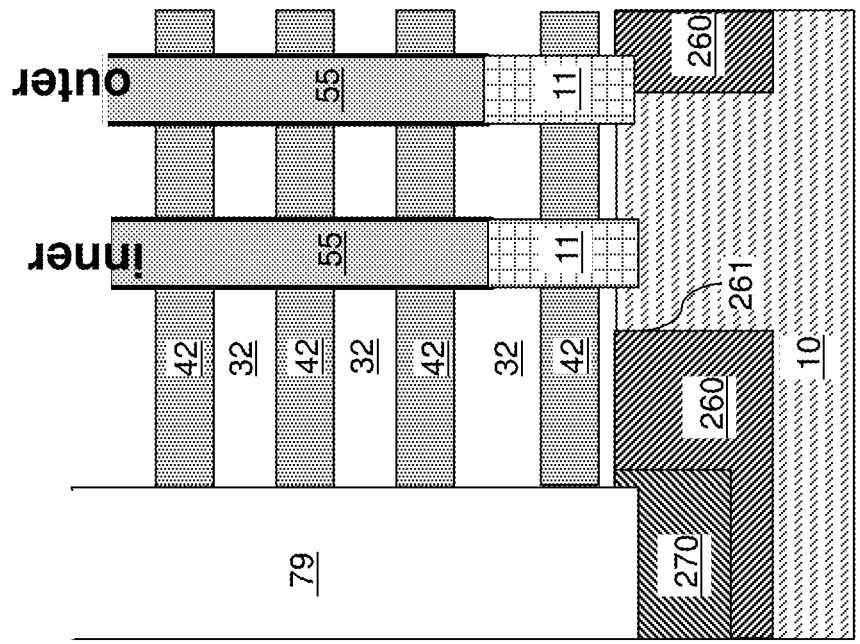
FIG. 6C is a vertical cross-sectional view of the exemplary structure of FIG. 6B along the vertical plane C-C' of FIG. 6B.
Figure 6D:
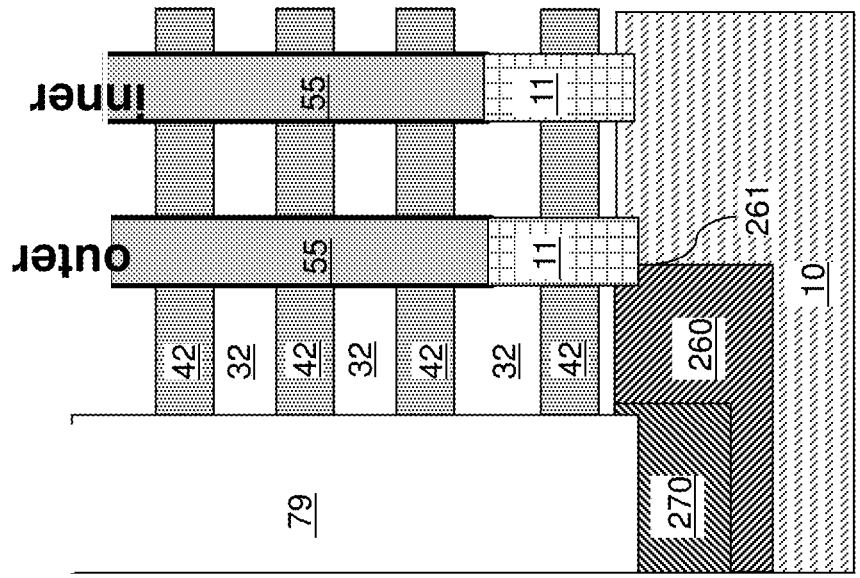
FIG. 6D is a vertical cross-sectional view of the exemplary structure of FIG. 6B along the vertical plane D-D' of FIG. 6B.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar 7P can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing. Alternatively, the memory contact structures 88 may be formed at a later step such as a step corresponding to FIGS. 11A-11E.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Each backside contact trench 79 extends through the alternating stack (32, 42) and to the substrate (9, 10). Two ion implantation processes can be performed to form an implant region 250 in a portion of the substrate (9, 10) (which may be a portion of the semiconductor material layer 10) that underlies each the backside contact trench 79. As used herein, a first element underlies a second element if a vertical line perpendicular to the top substrate surface 7 passes through both first and second elements. The two ion implantation process includes a p-type dopant implantation process that implants a p-type dopant such as boron, and an n-type dopant implantation process that implants an n-type dopant such as arsenic or phosphorus.

In one embodiment, the species of the p-type dopants and the n-type dopants are selected such that the dopants of the first conductivity type (which is the conductivity type of the doped well in the semiconductor material layer 10) has a greater diffusivity at an elevated temperature to be employed for a subsequent anneal process than dopants of the second conductivity type (which is the opposite of the first conductivity type) at the elevated temperature. In one embodiment, the first conductivity type can be p-type, and the p-type dopants implanted to form the implant region 250 can include boron atoms, and the n-type dopants implanted to form the implant region 250 can include arsenic atoms and/or phosphorus atoms. The dose of the dopants of the first conductivity type can be the same as, can be greater than, or can be less than, the dose of the dopants of the second conductivity type, provided that a region located directly underneath a backside contact trench 79 can form a source region having a net doping of the second conductivity type.

The atomic concentration of the dopants of the first conductivity type in the implant region 250 may be in a range from $1.0 \times 10^{16}/cm^3$ to $5 \times 10^{18}/cm^3$, such as $1.0 \times 10^{17}/cm^3$ to $5.0 \times 10^{17}/cm^3$ although lesser and greater atomic concentrations can also be employed. The atomic concentration of the dopants of the second conductivity type in the implant region may be in a range from $1.0 \times 10^{19}/cm^3$ to $5.0 \times 10^{21}/cm^3$, although lesser and greater atomic concentrations can also be employed. The order of the implantation process that implants the dopants of the first conductivity type and the implantation process that implants the dopants of the second conductivity type may be arbitrarily selected. In an illustrative example, boron can be employed as dopants of the first conductivity type. Implantation energy in a range from 5 keV to 20 keV, and a dose in a range from $1.0 \times 10^{14}/cm^2$ to $3.0 \times 10^{14}/cm^2$ can be employed. In an illustrative example, arsenic can be employed as dopants of the second conductivity type Implantation energy in a range from 20 keV to 40 keV, and a dopse in a range from $1.0 \times 10^{15}/cm^2$ to $2.0 \times 10^{15}/cm^2$ can be employed. Therefore, at least one, and preferably both of the implantation energy and dose for the ions of the first conductivity type are smaller than the implantation energy and dose for the ions of the second conductivity type.

Referring to FIGS. 6A-6D, an anneal process is performed at an elevated temperature to outdiffuse the p-type dopants and the n-type dopants. The elevated temperature can be in a range from 600 degrees Celsius to 1,150 degrees Celsius, although lesser and greater temperatures can also be employed. The p-type and n-type dopants, i.e., the dopants of the first conductivity type and the dopants of the second conductivity type, outdiffuse simultaneously from the implant region 250 during the anneal process.

Dopants of the first conductivity type outdiffuse faster and farther than dopants of the second conductivity type to form a doped pocket region 260. The doped pocket region 260 has a doping of the first conductivity type, and includes dopants of the first conductivity type at a second dopant concentration that is higher than the first dopant concentration level of the doped well region, which is a portion of the semiconductor material layer 10 that contacts the doped pocket region 260. The second dopant concentration level in region 260 can be in a range from $1.0 \times 10^{16}/cm^3$ to $1.0 \times 10^{20}/cm^3$, including $1.0 \times 10^{17}/cm^3$ to $5.0 \times 10^{18}/cm^3$ although lesser and greater dopant concentration levels can also be employed. The ratio of the second dopant concentration level to the first dopant concentration level can be in a range from 3 to 300, although lesser and greater ratios can also be employed. In one embodiment, the dopants in the doped pocket region 260 can consist of dopants of the first conductivity type.

Dopants of the second conductivity type outdiffuse slower than dopants of the first conductivity type. A source region 270 having a doping of the second conductivity type is formed within the pocket region 260 that underlies each backside contact trench 79. The source region 270 includes dopants of the first conductivity type and dopants of the second conductivity type. The atomic concentration of the dopants of the second conductivity type is greater than the atomic concentration of the dopants of the first conductivity type in the source region 270 due to greater outdiffusion of dopants of the first conductivity type away from the region underlying the backside contact trench 79 and/or die to a difference in the implant dose and/or depth for the dopants of the first and the second conductivity type. The doping of the source region 270 is determined by the difference between the atomic concentration of dopants of the second conductivity type and the atomic concentration of dopants of the first conductivity type, which is positive within the source region 270 and is negative within the doped pocket region 260. The net concentration level of dopants of the second conductivity type in the source region 270, which is the average of the difference of the atomic concentration of dopants of the second conductivity type and the atomic concentration of dopants of the first conductivity type in the source region 270, can be in a range from $1.0 \times 10^{19}/cm^3$ to $2.0 \times 10^{21}/cm^3$, although lesser and greater dopant concentration levels can also be employed.

In an illustrative example, boron can be employed as dopants of the first conductivity type. The distance of lateral diffusion of boron can be in a range from 100 nm to 150 nm, and a peak concentration of boron within the source region can be in a range from $1.0 \times 10^{17}/cm^2$ to $5.0 \times 10^{17}/cm^2$, although lesser and greater lateral diffusion distances and/or lesser and greater peak dopant concentrations can also be employed. The depth of the pocket region 260 can be in a range from 250 nm to 400 nm, although lesser and greater depths can also be employed.

In an illustrative example, arsenic can be employed as dopants of the second conductivity type. A peak concentration of arsenic within the source region can be about $1.0 \times 10^{20}/cm^2$ to $5.0 \times 10^{20}/cm^2$, although lesser and greater lateral diffusion distances and/or lesser and greater peak dopant concentrations can also be employed. The depth of the source region 270 can be in a range from 100 nm to 150 nm, although lesser and greater depths can also be employed.

The process parameters of the ion implantation process and/or of the anneal process, including the elevated temperature of the anneal process and the duration of the anneal process at the elevated temperature, can be selected such that an interface 261 between the doped pocket region 260 and the doped well in layer 10 is located underneath first (outer) memory stack structures 55 overlying an outer epitaxial channel portion 11O, and is not formed underneath second (inner) memory stack structures 55 overlying an inner epitaxial channel portion 11I. The first (outer) memory stack structures 55 are located closer to the nearest trench 79 than the second (inner) memory stack structures. If the optional epitaxial channel portions 11 are present, then the first (outer) epitaxial channel portions 11I are located closer to the nearest trench 79 than the second (inner) epitaxial channel portions 11O. In one non-limiting embodiment, the outer epitaxial channel portions 11O comprise a subset of the epitaxial channel portions 11 for which the lateral separation distance from a most proximal backside contact trench 79 does not exceed the sum of the minimum separation distance between the most proximal backside contact trench 79 and the epitaxial channel portions 11 and one half of the maximum lateral dimension MLD (i.e., diameter of portion 11 divided by two), of an epitaxial channel portion 11. The lateral separation distance for an outer epitaxial channel portion 11O is herein referred to as a first lateral separation distance LSD1. Inner epitaxial channel portions 11I refer to the subset of the epitaxial channel portions 11 for which the lateral separation distance from a most proximal backside contact trench 79 exceed the sum of the minimum separation distance between the most proximal backside contact trench 79 and the epitaxial channel portions 11 and one half of the maximum lateral dimension MLD of an epitaxial channel portion 11. The lateral separation distance for an inner epitaxial channel portion 11I is herein referred to as a second lateral separation distance LSD2. If epitaxial channel portions are omitted, then the memory stack structures 55 overly layer 10 rather than portion 11, and the distances LSD1 and LSD2 are measured between the structures 55 and the trench 79, and dimension MLD is the diameter at the height midpoint of the structures 55.

For at least one of the outer epitaxial channel portion 11O, the lateral separation distance is the same as the minimum separation distance from the most proximal backside contact trench 79. In case the memory stack structures 55 are arranged in a periodic two-dimensional array, and the direction of periodicity is the same as the lengthwise direction of the most proximal backside contact trench 79, the outer epitaxial channel portions 11O within a same row can have the same first lateral separation distance LSD1, which is the same as the minimum separation distance from the backside contact trench 79. The inner epitaxial channel portions 11I can have different second lateral separation distances LSD2 (which are greater than distances LSD1) depending on the row in which each respective inner epitaxial channel portion 11I is located.

Each memory stack structure 55 overlying an outer epitaxial channel portion 11O is herein referred to as a first memory stack structure, or an outer memory stack structure. Each memory stack structure 55 overlying an inner epitaxial channel portion 11I is herein referred to as a second memory stack structure, or an inner memory stack structure. In one embodiment, the process parameters of the anneal process can be selected such that the interface 261 between the doped pocket region 260 and the doped well (located within the semiconductor material layer 10) underlies each of the first memory stack structures among the plurality of memory stack structures 55.

In one embodiment, the process conditions of the anneal process are selected such that the doped pocket region 260 does not underlie any of the second (inner) memory stack structures, but underlies at least a portion of the first (outer) memory stack structures among the plurality of memory stack structures 55. Each of the plurality of memory stack structures 55 comprises a semiconductor channel 60 of a respective transistor. In one embodiment, the process conditions of the anneal process can be selected such that the difference between the mean threshold voltage of the first memory stack structures and the mean threshold voltage of the second memory stack structure is not greater than 0.5 V, such as 0 to 0.5V, for example 0.1 to 0.25V. The mechanism for providing such uniform distribution of threshold voltages for the transistors of the first and second memory stack structures 55 is discussed below.

The doped pocket region 260 laterally surrounds the source region 270. Further, the bottom surface of the source region 270 can be vertically spaced from the doped well (within the semiconductor material layer 10) by a horizontal portion of the doped pocket region 260. In one embodiment the thickness of the horizontal portion of the doped pocket region 260 can be substantially the same as the least distance between an inner sidewall adjacent to source region 270 and an outer sidewall (i.e., interface 261) of the doped pocket region 260.

In one embodiment, the first conductivity type can be p-type, the second conductivity type can be n-type, the doped pocket region 260 can comprise boron as dopants of the first conductivity type, and the source region 270 can comprises boron and at least one of arsenic and phosphorus such that the atomic concentration of the n-type dopants is greater than the atomic concentration of the p-type dopants within the source region 270.

The epitaxial channel portions 11 have a doping of the first conductivity type. The epitaxial channel portions 11 (as provided by in-situ doping during formation of the epitaxial channel portions 11 at a processing step of FIG. 2B) can be heavily doped, e.g., at an atomic concentration in a range from $1.0 \times 10^{19}/cm^3$ to $1.0 \times 10^{21}/cm^3$. Thus, the threshold voltage of the field effect transistors in each memory stack structure 55 is not determined by the dopant concentration of the epitaxial channel portions 11, but is determined by the dopant profile within the horizontal portions of each semiconductor channel that extends to a most proximal source region 270. Thus, the dopant profile in the doped pocket region 260 and the doped well determines the threshold voltage of the field effect transistors. Specifically, the threshold voltage of each transistor including a semiconductor channel 60 as a component of the channel can be determined by the geometry and the dopant concentration of the pocket region 260. By providing an areal overlap between the area of the doped pocket region 260 and the first (outer) memory stack structures while not providing any overlap between the area of the doped pocket region 260 and the second (inner) memory stack structures, the threshold voltages of the transistors of vertical memory devices can be within a predefined tolerance limit (which can be, for example, less than 0.5 V between the transistors including a channel extending through a first memory stack structure and the transistors including a channel extending through a second memory stack structure). The mechanism for controlling the threshold voltages at, or around, a target is discussed below with respect to FIGS. 11A-12 after the final structure of the devices of the present disclosure is described.

Figure 7:
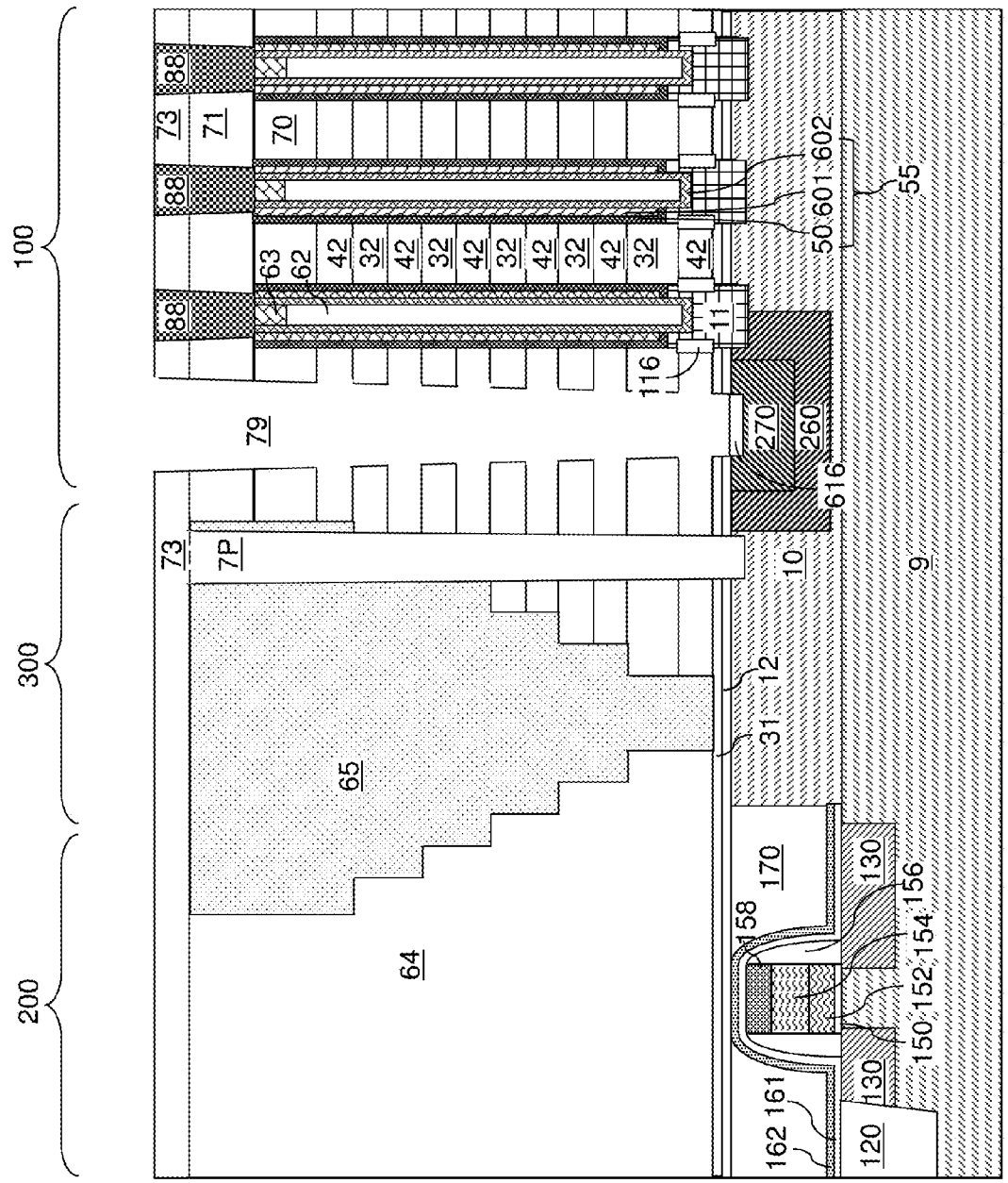
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 270 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 270 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 270 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 270.

Figure 8:
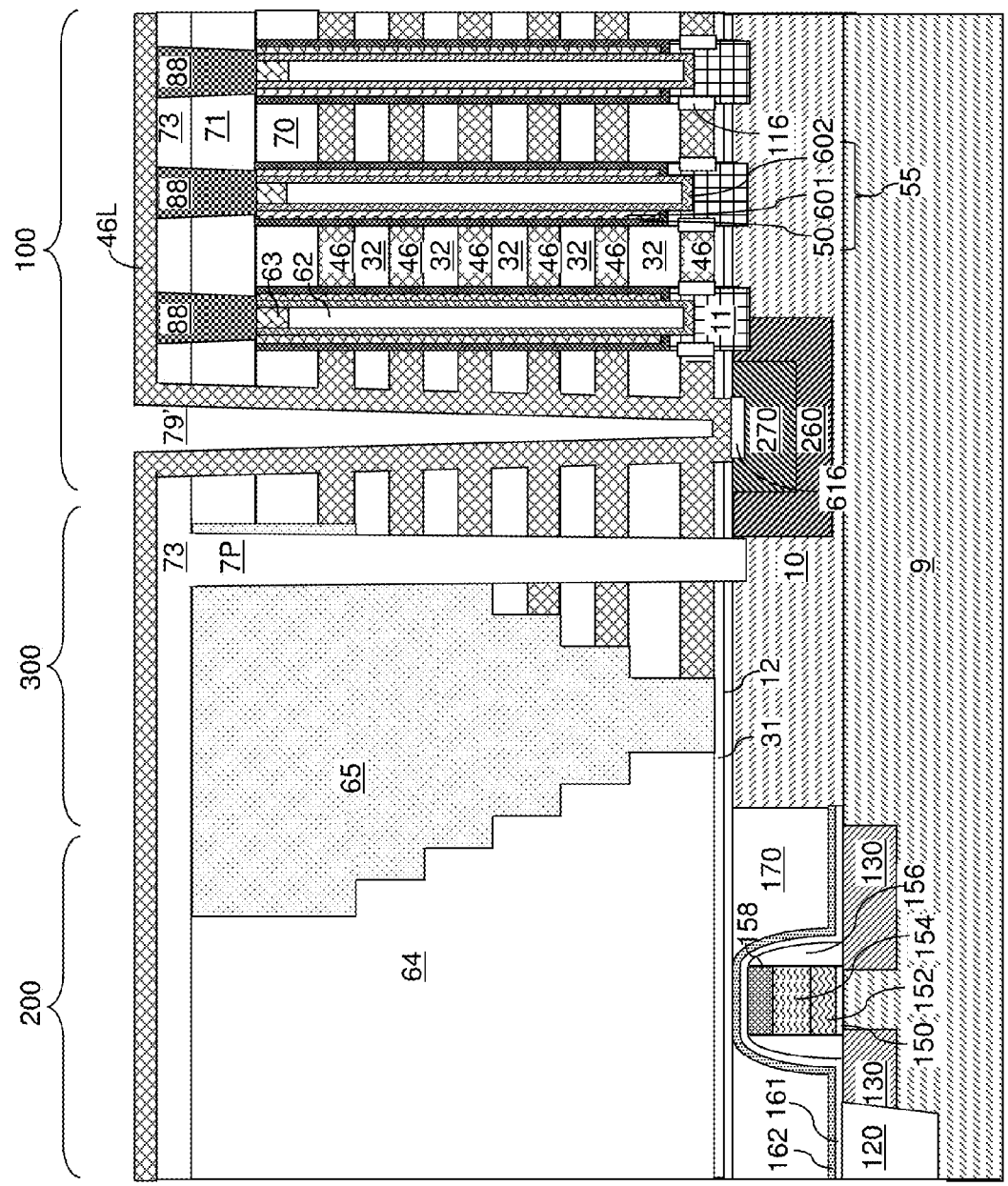
FIG. 8 is a vertical cross-sectional view of the exemplary structure after formation of electrically conductive layers according to an embodiment of the present disclosure.

Referring to FIG. 8, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric 502 is present within each memory opening, the backside blocking dielectric layer is optional. In case a blocking dielectric layer 502 is omitted, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, WF6 and H2 can be employed during the deposition process.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the contiguous metallic material layer 46L.

Figure 9:
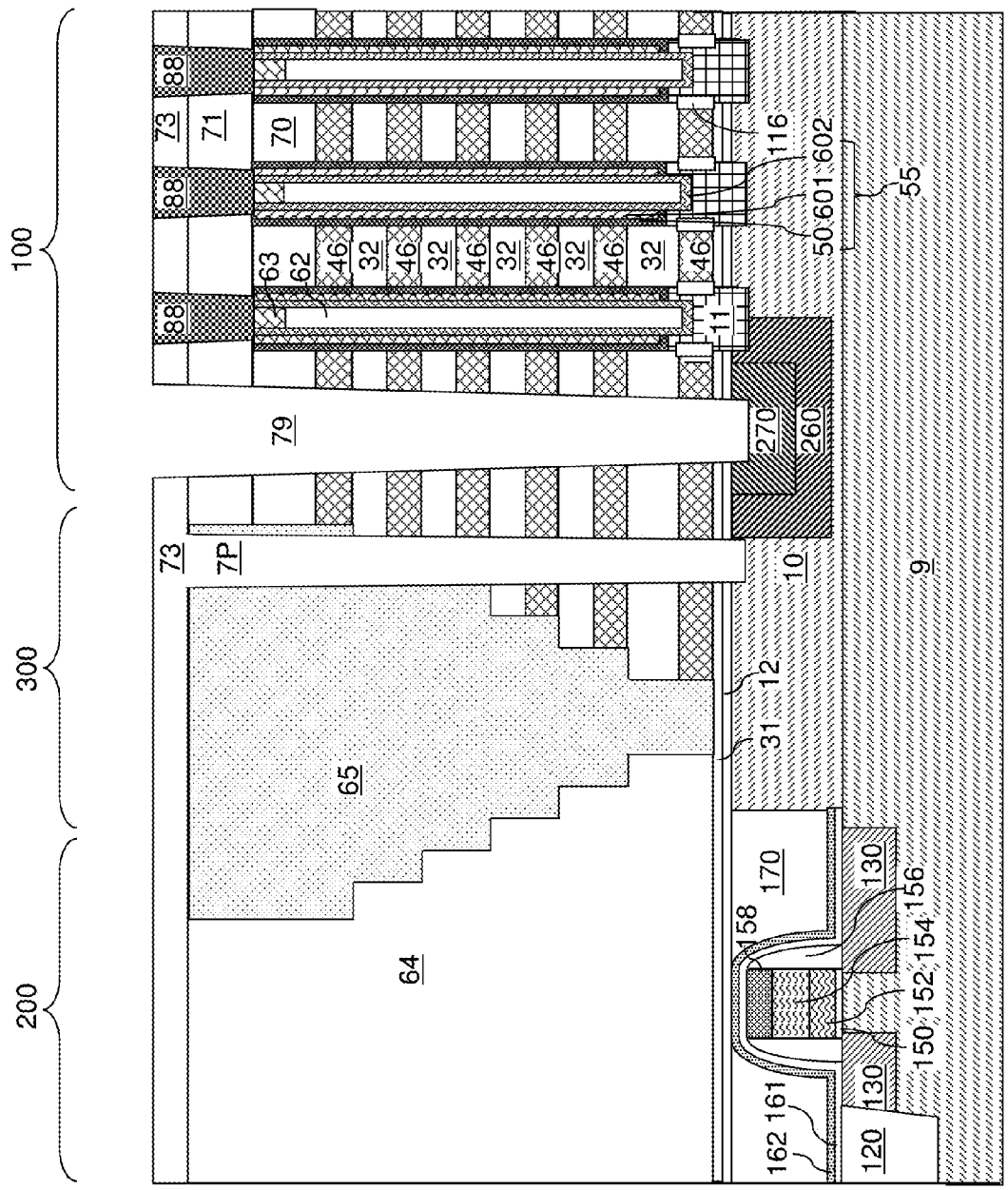
FIG. 9 is a vertical cross-sectional view of the exemplary structure after removal of a deposited conductive material from within the backside contact trench according to an embodiment of the present disclosure.

Referring to FIG. 9, the deposited metallic material of the contiguous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 270 during the last processing step of the anisotropic etch.

Figure 10:
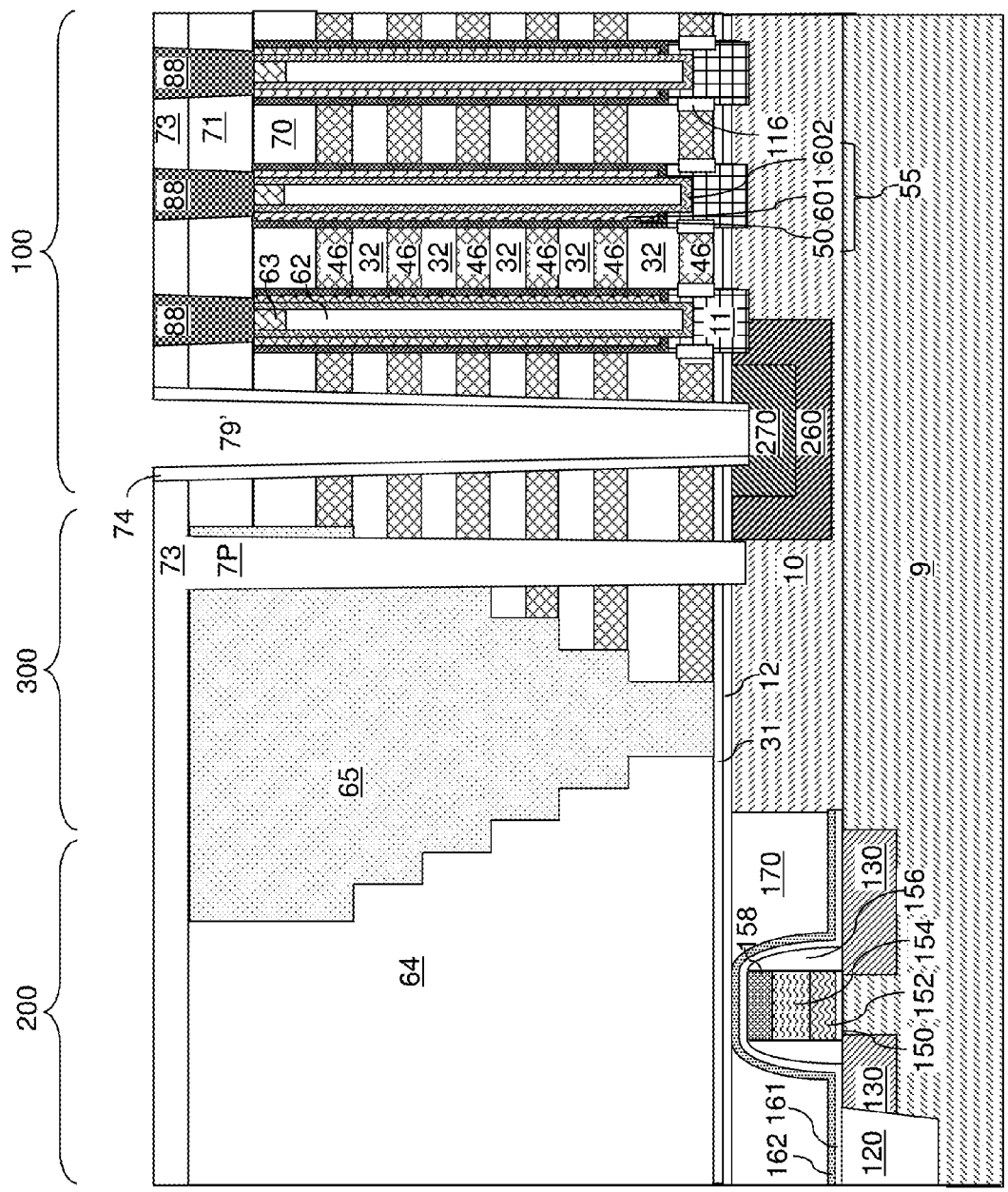
FIG. 10 is a vertical cross-sectional view of the exemplary structure after formation of an insulating spacer according to an embodiment of the present disclosure.

Referring to FIG. 10, an insulating material layer can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer 66 from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 270.

Each insulating spacer 74 can be formed over the sidewalls of the backside contact trench 79, and can be formed directly on substantially vertical sidewalls of the backside blocking dielectric layer 66 and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a backside cavity 79'.

Referring to FIGS. 11A-11E, a backside contact via structure 76 is formed in each backside cavity 79' by deposition of at least one conductive material, which can include a metallic liner (such as TiN, TaN, or WN) and a conductive fill material (such as W, Cu, Al, Co, Ru, or a combination thereof). Excess portions of the at least one conductive material can be removed, for example, by chemical mechanical planarization (CMP).

Various additional contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A. In one embodiment, the memory contact via structures 88 may be formed during the same step as the peripheral device contact via structures (8G, 8A). Likewise, word line contact via structures (not shown for clarity) may also be formed during the same processing steps to contact the word lines.

Each field effect transistor (e.g., source select transistor) that controls flow of electrical current through a memory stack structure 55 includes a vertical channel composed of a semiconductor channel 60 and an optional epitaxial channel portion 11, and a horizontal channel portion that includes a portion of the doped pocket region 260 and may include a portion of a doped well, which can be a portion of the semiconductor material layer 10 located between the doped pocket region 260 and a respective epitaxial channel portion 11. The mechanism for controlling the threshold voltages of field effect transistors includes control of electron mobility at, and near, the interface between the doped pocket region 260 and the doped well.

Figure 11A:
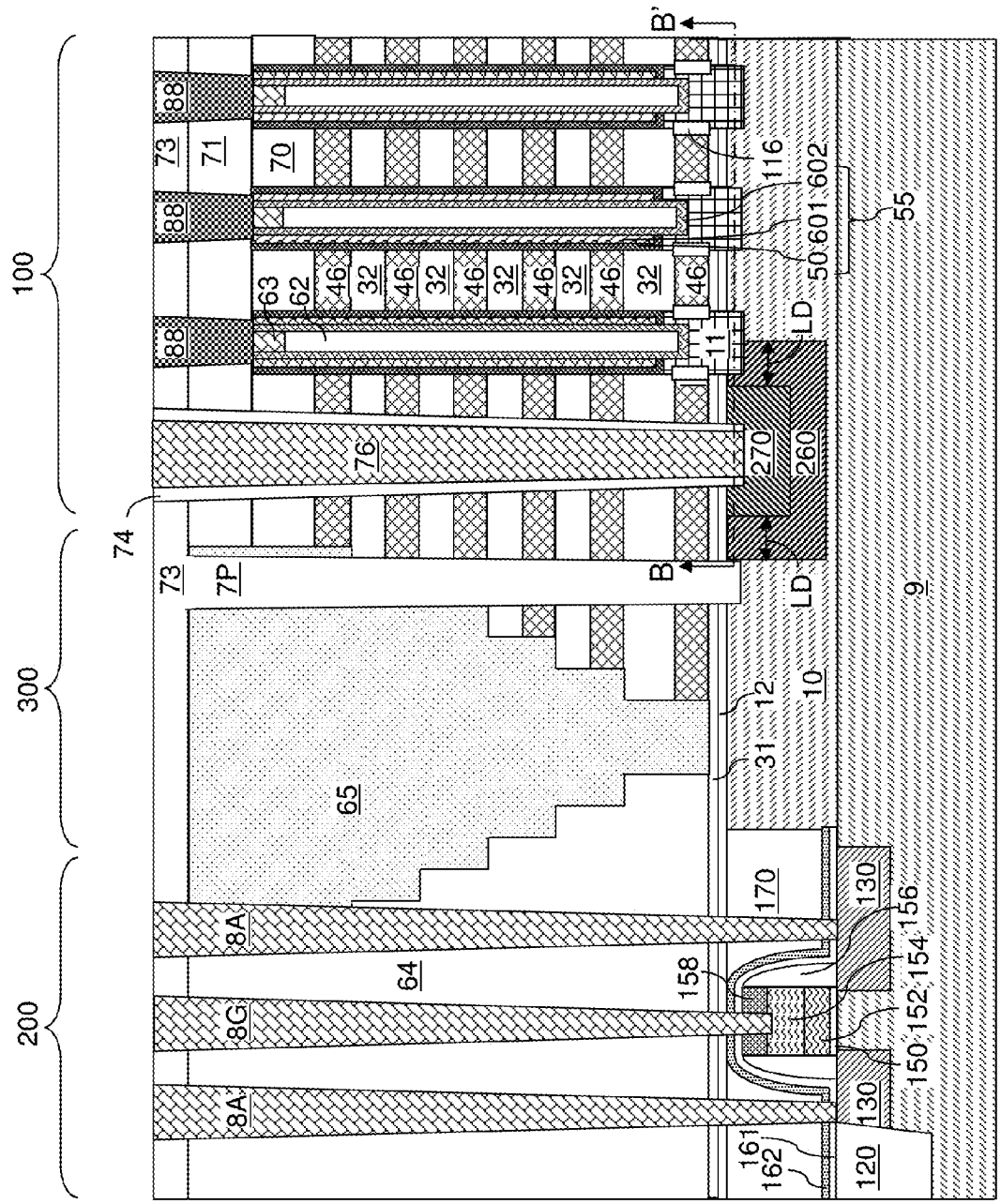
FIG. 11A is a vertical cross-sectional view of the exemplary structure after formation of a backside contact via structure and additional contact via structures according to an embodiment of the present disclosure.
Figure 11B:
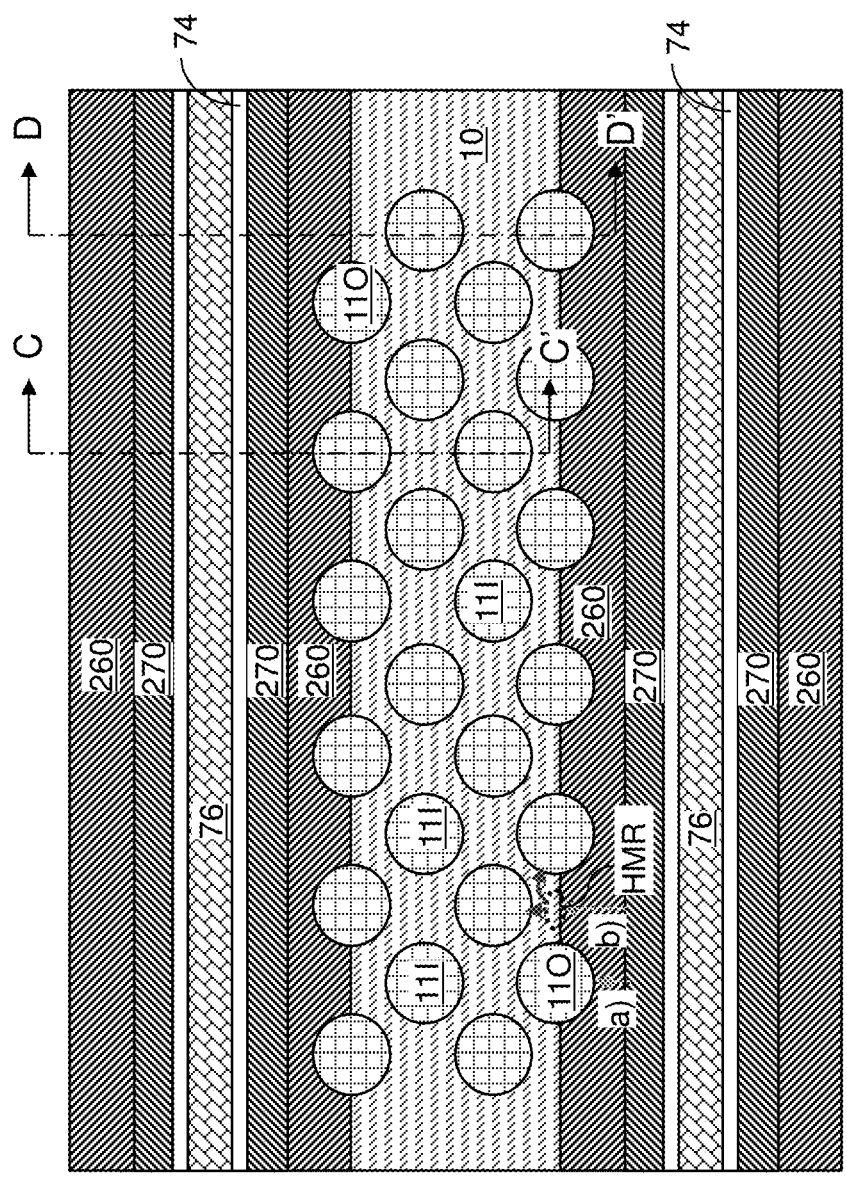
FIG. 11B is a horizontal cross-sectional view of exemplary structure of FIG. 11A along the horizontal plane B-B' of FIG. 11A.
Figure 11C:
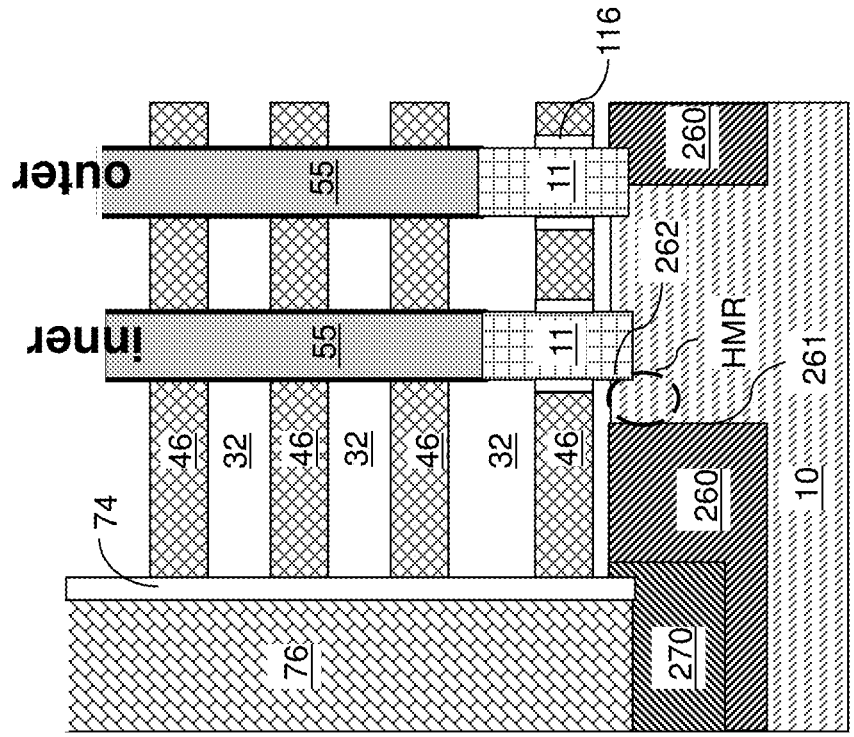
FIG. 11C is a vertical cross-sectional view of the exemplary structure of FIG. 11B along the vertical plane C-C' of FIG. 11B.

Specifically, as shown in FIG. 11C, for a field effect transistor including an outer epitaxial channel portion 11O and an overlying semiconductor channel 60 of a first (outer) memory stack structure 55, a high threshold voltage region HVTR is formed around the interface 261 between the doped pocket region 260 and the doped well (which can be a portion of the semiconductor material layer 10). The relatively high dopant concentration level of the first conductivity type dopants in the doped pocket region 260 compared to the dopant concentration level in the well in layer 10 induces formation of the high threshold voltage region HVTR, in which the gate electric field generated by the gate voltage applied to a source select gate electrode (as embodied as the lowest level electrically conductive layer 46) is weak. The weak gate electric field forms a path of low charge carrier mobility in the high threshold voltage region HVTR. For example, if the first conductivity type is p-type, the high threshold voltage region HVTR provides a region of low electron mobility.

Figure 11D:
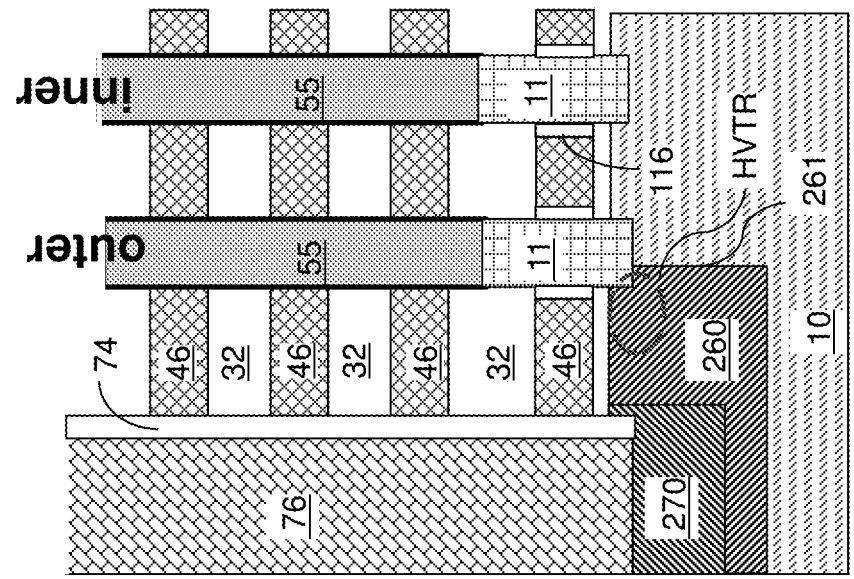
FIG. 11D is a vertical cross-sectional view of the exemplary structure of FIG. 11B along the vertical plane D-D' of FIG. 11B.

In contrast, as shown in FIG. 11D, high mobility regions HMR are formed in the lower p-type dopant concentration well in layer 10 near a top portion of the interface 261 between the higher p-type dopant concentration region 260 and portion 11. A high mobility region HMR can be provided at the junction of the first interface 261 and a second interface 262. The second interface 262 is the interface between the doped well in layer 10 and dielectric material layers (12, 31) that function as a gate dielectric, and the first interface 261 is the same interface between the doped pocket region 260 and the doped well in layer 10 described above. Due to low atomic concentration of the dopants of the first conductivity type in the doped well in layer 10 compared to in region 260 and portion 11, charge carrier mobility is enhanced in each high mobility region HMR, and the high mobility regions HMR becomes primary paths for opposite conductivity type charge carrier conduction within the channels of the field effect transistors. For example, if the first conductivity type is p-type, the high mobility regions HMR provides primary paths for electron conduction in the channels of the field effect transistors.

Figure 11E:
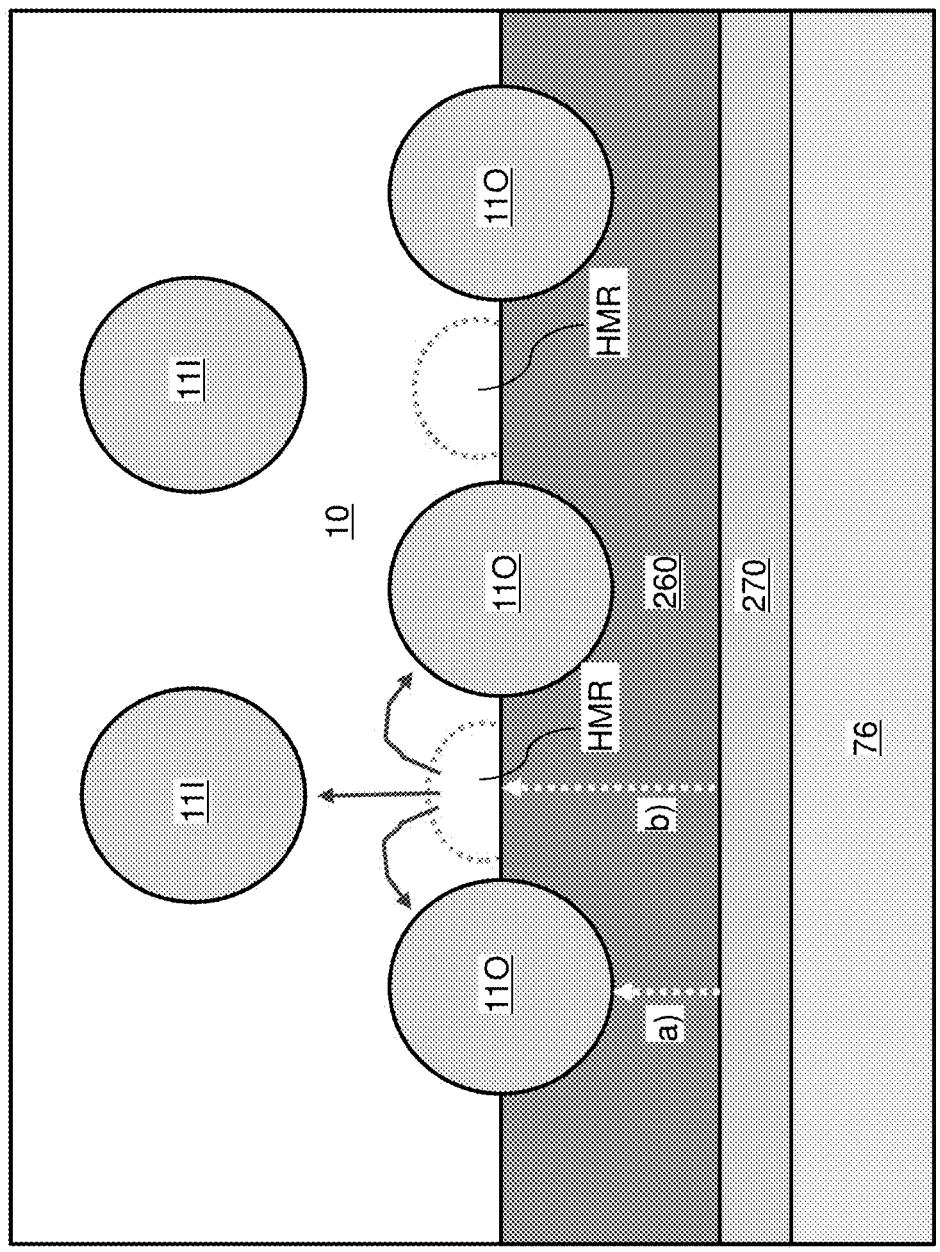
FIG. 11E is a magnified view of a region of FIG. 11B.

Without wishing to be bound by a particular theory, it is believed that by inducing an areal overlap between the doped pocket region 260 and the outer epitaxial channel portions 11O through the anneal process (which forms the doped pocket region 260) while preventing an areal overlap between the doped pocket region 260 and the inner epitaxial channel portions 11I, the high threshold voltage regions HVTR are formed only in contact with the outer epitaxial channel portions 11O, and not in contact with the inner epitaxial channel portions 11I. Thus, the shortest charge carrier path a) illustrated in FIG. 11E is not a path that provides majority of electrical current during the on-state for a field effect transistor including an outer epitaxial channel portion 11O. In contrast, a predominant portion (i.e., majority) of charge carriers injected from the source region 270 passes through the high mobility regions HMR even for a field effect transistor including an outer epitaxial channel portion 11O as indicated by a primary current path b) illustrated in FIG. 11E.

For a field effect transistor including an inner epitaxial channel portion 11I, a predominant portion of charge carriers passes through a high mobility region HMR. Therefore, the high mobility regions HMR determine the level of on-current for each field effect transistor for the vertical memory devices including the memory stack structures 55. The threshold voltages for the field effect transistors are determined by the dopant concentration profiles in the high mobility regions HMR. Correspondingly, the threshold voltages for the field effect transistors can be the same irrespective of the locations of the memory stack structures 55, and the threshold voltage differential between the first (outer) memory stack structures and the second (inner) memory stack structures, which would be present in the absence of the doped pocket region 260, can be eliminated or minimized. In other words, by forming the doped pocket region 260 that partially overlaps the areas of only the outer but not inner stack structures, the same threshold voltages can be provided for the field effect transistors of the outer memory stack structures and the inner memory stack structures, and the threshold voltage differential between the outer memory stack structures and the inner memory stack structures can be minimized or eliminated.

Figure 12:
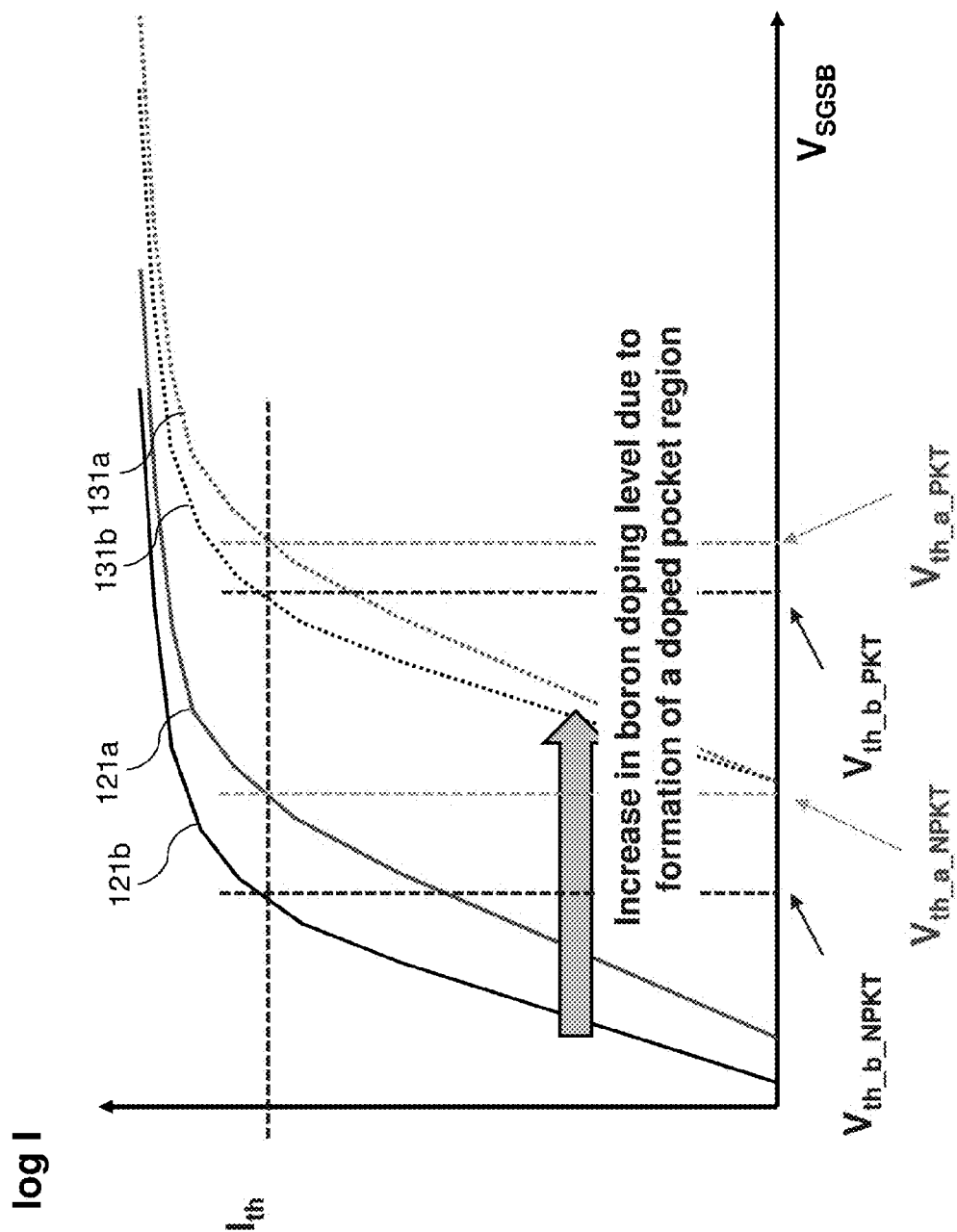
FIG. 12 is a simulated current voltage plot illustrating a difference in the channel current through an outer device semiconductor channel and an inner device semiconductor channel due to presence of a doped pocket region according to an embodiment of the present disclosure.

FIG. 12 illustrates a simulated current voltage plot illustrating a difference in the channel current through an outer device semiconductor channel and an inner device semiconductor channel due to presence of a doped pocket region according to an embodiment of the present disclosure. The x-axis represents the gate bias voltage, which can be the source-side select gate voltage $V_{SGSB}$. The y-axis represents the channel current as a function of the gate bias voltage. The graph illustrates the channel current for four n-type field effect transistors employing a p-doped well as a portion of a respective channel. A first curve 121a represents the channel current for an outer field effect transistor that does not employ a doped pocket region, i.e., a conventional field effect transistor including an outer epitaxial channel portion and not employing the configuration of the embodiments of the present disclosure. A second curve 121b represents the channel current for an inner field effect transistor that does not employ a doped pocket region, i.e., a conventional field effect transistor including an inner epitaxial channel portion and not employing the configuration of the embodiments of the present disclosure. A third curve 131a represents the channel current for an outer field effect transistor of the present disclosure, i.e., a field effect transistor including an outer epitaxial channel portion 11O with pocket 260 according to the embodiments of the present disclosure. A fourth curve 131b represents the channel current for an inner field effect transistor of the present disclosure, i.e., a field effect transistor including an inner epitaxial channel portion 11I and pocket region 260 according to the embodiments of the present disclosure. The channel current I is plotted on a log scale. The threshold channel current $I_{th}$ that determines the threshold voltages of the field effect transistors is shown as a horizontal line.

As described with respect to FIGS. 11C and 11D, even under the same gate select electrode (as embodied as a bottommost electrically conductive layer 46), different threshold voltage ($V_t$) regions are formed along path a) and path b) in FIG. 11E. A high threshold voltage region HVTR is formed at the corner part of each outer epitaxial channel portion 11O. HVTR has a higher threshold voltage than the horizontal portion of the channel in the well in layer 10. In case the first conductivity type is p-type and the second conductivity type is n-type, electrons pass from the source region 270 to a respective semiconductor channel within the memory stack structures 55 through a horizontal channel portion between the source region 270 and a respective epitaxial channel portion 11, and through a vertical portion which is an epitaxial channel portion 11. The electric field from the select gate electrode is weaker in the high threshold voltage region HVTR located at the corner part of each outer epitaxial channel portion 11O than in other parts of the pocket region 260, such as in the horizontal channel part in the pocket region 260. This is believed to be due to the lower density of electric force lines from the select gate in this corner region, due to the channel shape at the corner.

Furthermore, it is believed that the electric field from the select gate electrode is weaker in the high threshold voltage region HVTR located at the corner part of each outer epitaxial channel portion 11O than the electric field from the same select gate electrode at the corner part of each inner epitaxial channel portion 11I. The threshold voltage is likewise higher in HVTR than at the corner of the inner epitaxial channel portions 11I. This is believed to occur because the corner part of each outer epitaxial channel portion 11O is located in the heavier doped pocket region 260, while the corner part of each inner epitaxial channel portion 11I is located in the lighter doped well in layer 10.

The threshold voltage of path a) is determined by the threshold voltage of the HVTR. Thus, the threshold voltage along path a) is higher than along path b) and the mobility of electrons along the path a) is lower than the mobility of electrons along the path b). Thus, electrons are believed to selectively follow the path b) rather than path a) to be injected into the semiconductor channels in the memory stack structures 55.

The effect of the increase in boron doping due to formation of a doped pocket region 260 is schematically shown as shifts of the current curves from the first curve 121a to the third curve 131a, and from the second curve 121b to the fourth curve 131b. The corresponding shifts in the threshold voltage due to formation of a doped pocket region 260 are also shown, which include the shift from the threshold voltage for an outer transistor without a doped pocket region $V_{th\_a\_NPKT}$ to the threshold voltage for an outer transistor with a doped pocket region $V_{th\_a\_PKT}$, and the shift from the threshold voltage for an inner transistor without a doped pocket region $V_{th\_b\_NPKT}$ to the threshold voltage for an inner transistor with a doped pocket region $V_{th\_b\_PKT}$. In one embodiment, the difference between outer and inner transistors with the pocket region (i.e., the difference between $V_{th\_a\_PKT}$ and $V_{th\_b\_PKT}$) is less than the difference between outer and inner transistors without the pocket region (i.e., the difference between $V_{th\_a\_NPKT}$ and $V_{th\_b\_NPKT}$) can be reduced through use of the doped pocket region 260.

In one embodiment, the exemplary structure of the present disclosure can include a monolithic three-dimensional memory device. The monolithic three-dimensional memory device can include a stack of alternating layers comprising insulating layers 32 and electrically conductive layers 46 and located over a doped well (which can be a portion of the semiconductor material layer 10 and/or the substrate semiconductor layer 9) located in a substrate (9, 10) and having a doping of a first conductivity type at a first dopant concentration level. A plurality of memory stack structures 55 extends through the stack of alternating layers. A first backside contact via structure 76 can extend through the stack and can be laterally spaced from the plurality of memory stack structures 55. A source region 270 underlies the first backside contact via structure 76, and has a doping of a second conductivity that is the opposite of the first conductivity type. A doped pocket region 260 laterally surrounds the source region 270. The doped pocket region 260 has a doping of the first conductivity type at a second dopant concentration level that is higher than the first dopant concentration level. An interface 261 between the doped pocket region 260 and the doped well underlies at least one first memory stack structure (which can be outer memory stack structures) among the plurality of memory stack structures 55.

In one embodiment, each of the at least one first memory stack structure contacts a top surface of a respective epitaxial channel portion 11O that contacts the interface 261. In one embodiment, at least one second memory stack structure among the plurality of memory stack structures 55 overlies the doped well in layer 10 and does not overlie the doped pocket region 260. In one embodiment, a lateral distance between the source region 270 and the doped well is uniform around a periphery of the source region 270. The uniform lateral distance is due to the uniform nature of the dopant diffusion that occurs during the anneal at an elevated temperature that is employed to form the doped pocket region 260. In one embodiment, each of the plurality of memory stack structures 55 comprises a semiconductor channel 60 of a respective vertical transistor. The difference between a mean threshold voltage of the at least one first memory stack structure (i.e., the outer memory stack structures overlying the outer epitaxial channel portions 11O) and a mean threshold voltage of the at least one second memory stack structure (i.e., the inner memory stack structures overlying the inner epitaxial channel portions 11I) is not greater than 0.5 V. In one embodiment, the difference between the mean threshold voltages of the first and second memory stack structures can be not greater than 0.3 V, such as 0 to 0.5 V, for example 0.1 to 0.25V. Thus, a difference between a mean threshold voltage of the at least one first (outer) memory stack structure and a mean threshold voltage of the at least one second (inner) memory stack structure is not greater than 0.5 V during operation of the memory device, such as during read, write or erase operation of the NAND device.

In one embodiment, the first backside contact via structure 76 laterally extends along a lengthwise direction, and the interface 261 between the doped pocket region 260 and the doped well in layer 10 can laterally extend along the same lengthwise direction. In one embodiment, a sidewall of the source region 270 laterally extends along the lengthwise direction, and the interface is laterally spaced from the sidewall of the source region 270 by a uniform lateral distance.

A second backside contact via structure 76 can extend through the stack. The plurality of memory stack structures 55 can be located between the first backside contact via structure 76 and the second backside contact via structure 76. In one embodiment, the first conductivity type is p-type, the second conductivity type is n-type, the doped pocket region 260 comprises boron as dopants of the first conductivity type, and the source region 270 comprises arsenic or phosphorus and additionally comprises boron at a concentration lower than the atomic concentration of arsenic and phosphorus. In one embodiment, the atomic concentration of dopants of the first conductivity type (such as boron concentration) in the source region 270 can be greater than the atomic concentration of dopants of the first conductivity type (such as boron concentration) in the doped pocket region 260.

In one embodiment, each memory stack structure 55 can include, from outside to inside, at least one blocking dielectric (501, 503), a memory material layer 504, a tunneling dielectric 506, and a semiconductor channel 60 contacting an overlying drain region 63.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10). In one embodiment, the plurality of semiconductor channels can comprise horizontal semiconductor channel portions that include a doped well (which is a portion of the semiconductor material layer 10) and the doped pocket region 260 located between a source region 270 and the inner and outer epitaxial channel portions (11I, 11O), and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a stack of alternating layers comprising insulating layers and electrically conductive layers and located over a semiconductor region having a doping of a first conductivity type at a first dopant concentration level;
   a plurality of memory stack structures extending through the stack;
   a first backside contact via structure extending through the stack and laterally spaced from the plurality of memory stack structures;
   a source region underlying the first backside contact via structure and having a doping of a second conductivity that is the opposite of the first conductivity type; and
   a doped pocket region laterally surrounding the source region, having a doping of the first conductivity type at a second dopant concentration level that is higher than the first dopant concentration level, wherein an interface between the doped pocket region and the semiconductor region underlies at least one first memory stack structure among the plurality of memory stack structures.

2. The monolithic three-dimensional memory device of claim 1, wherein:
   the semiconductor region comprises a doped well located in or over a substrate; and
   at least one second memory stack structure among the plurality of memory stack structures overlies the doped well and does not overlie the doped pocket region.

3. The monolithic three-dimensional memory device of claim 2, wherein each of the at least one first memory stack structure contacts a top surface of a respective epitaxial channel portion that contacts the interface.

4. The monolithic three-dimensional memory device of claim 2, wherein a lateral distance between the source region and the doped well is uniform around a periphery of the source region.

5. The monolithic three-dimensional memory device of claim 2, wherein:

each of the plurality of memory stack structures comprises a semiconductor channel of a respective vertical transistor; and a difference between a mean threshold voltage of the at least one first memory stack structure and a mean threshold voltage of the at least one second memory stack structure is not greater than 0.5 V.

6. The monolithic three-dimensional memory device of claim 2, wherein:

the at least one first memory stack structure comprises a outer row of first memory stack structures; and the at least one second memory stack structure comprises an inner row of first memory stack structures which is located farther from the first backside contact via structure than the outer row.

7. The monolithic three-dimensional memory device of claim 1, wherein:

the first backside contact via structure laterally extends along a lengthwise direction;

the interface laterally extends along the lengthwise direction;

a sidewall of the source region laterally extends along the lengthwise direction; and the interface is laterally spaced from the sidewall of the source region by a uniform lateral distance.

8. The monolithic three-dimensional memory device of claim 1, further comprising a second backside contact via structure extending through the stack, wherein the plurality of memory stack structures are located between the first backside contact via structure and the second backside contact via structure.

9. The monolithic three-dimensional memory device of claim 1, wherein:

the first conductivity type is p-type;

the second conductivity type is n-type;

the doped pocket region comprises boron as dopants of the first conductivity type; and the source region comprises arsenic or phosphorus as dopants of the second conductivity type.

10. The monolithic three-dimensional memory device of claim 2, wherein each memory stack structure comprises, from outside to inside:

at least one blocking dielectric, a memory material layer, a tunneling dielectric, and a semiconductor channel contacting an overlying drain region.

11. The monolithic three-dimensional memory device of claim 10, wherein:

the monolithic three-dimensional memory device comprises a vertical NAND device located over the substrate;

the electrically conductive layers comprise, or are electrically connected to, a respective word line of the vertical NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

12. A method of manufacturing a memory device, comprising:

forming a stack of alternating layers comprising insulating layers and spacer material layers over a substrate;

forming a plurality of memory stack structures through the stack;

forming a backside contact trench extending through the stack and to the substrate;

forming an implanted region in a portion of the substrate underlying the backside contact trench by implanting first conductivity type dopants and second conductivity type dopants through the backside contact trench; and simultaneously outdiffusing the first and the second conductivity type dopants employing an anneal process performed at an elevated temperature.

13. The method of claim 12, wherein:

dopants of a first conductivity type diffuse farther than dopants of a second conductivity type to form a doped pocket region having a doping of the first conductivity type; and a source region having a doping of the second conductivity type is formed underneath the backside contact trench.

14. The method of claim 13, wherein:

the memory stack structures are formed over a doped well in the substrate, the doped well having a doping of the first conductivity type at a first dopant concentration level;

the doped pocket has a doping of the first conductivity type at a second dopant concentration level that is higher than the first dopant concentration level;

an interface between the doped pocket region and the doped well underlies at least one first memory stack structure among the plurality of memory stack structures; and the doped pocket region does not underlie at least one second memory stack structure among the plurality of memory stack structures.

15. The method of claim 14, wherein:

each of the plurality of memory stack structures comprises a semiconductor channel of a respective vertical transistor; and process conditions of the anneal process are selected such that a difference between a mean threshold voltage of the at least one first memory stack structure and a mean threshold voltage of the at least one second memory stack structure is not greater than 0.5 V.

16. The method of claim 14, wherein:

the at least one first memory stack structure comprises a outer row of first memory stack structures; and the at least one second memory stack structure comprises an inner row of first memory stack structures which is located farther from the backside contact trench than the outer row.

17. The method of claim 13, further comprising:
forming a backside contact via structure within the backside contact trench;
forming memory openings extending through the stack of alternating layers and to the substrate; and
forming an epitaxial channel portion in each memory opening,
wherein:
the memory stack structures are formed on a respective epitaxial channel portion; and
the doped pocket region laterally surrounds the source region.

18. The method of claim 13, wherein:
the first conductivity type is p-type;
the second conductivity type is n-type;
the doped pocket region comprises boron as dopants of the first conductivity type; and
the source region comprises arsenic or phosphorus as dopants of the second conductivity type.

19. The method of claim 12, wherein each memory stack structure comprises, from outside to inside:
at least one blocking dielectric,
a memory material layer,
a tunneling dielectric, and
a semiconductor channel contacting an overlying drain region.

20. The method of claim 19, wherein:
the monolithic three-dimensional memory device comprises a vertical NAND device located over the substrate;
the spacer material layers are formed as electrically conductive layers or are replaced with electrically conductive layers;
the electrically conductive layers comprise, or are electrically connected to, a respective word line of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

21. A method of operating the monolithic three-dimensional memory device of claim 2, wherein a difference between a mean threshold voltage of the at least one first memory stack structure and a mean threshold voltage of the at least one second memory stack structure is not greater than 0.5 V during operation of the device.

* * * * *